(12) United States Patent
Yamada et al.

(10) Patent No.: US 10,203,554 B2
(45) Date of Patent: Feb. 12, 2019

(54) WAVELENGTH CONVERSION MEMBER, BACKLIGHT UNIT, AND LIQUID CRYSTAL DISPLAY DEVICE

(71) Applicant: FUJIFILM Corporation, Tokyo (JP)

(72) Inventors: Naoyoshi Yamada, Kanagawa (JP); Hideaki Ito, Kanagawa (JP); Toshio Hara, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 15/617,419

(22) Filed: Jun. 8, 2017

(65) Prior Publication Data

US 2017/0277002 A1 Sep. 28, 2017

Related U.S. Application Data

(63) Continuation of application No. PCT/JP2015/006066, filed on Dec. 7, 2015.

(30) Foreign Application Priority Data

Dec. 10, 2014 (JP) .................................. 2014-249955

(51) Int. Cl.
 G02F 1/1333 (2006.01)
 G02F 1/1335 (2006.01)
 (Continued)

(52) U.S. Cl.
 CPC .. *G02F 1/133621* (2013.01); *B29D 11/00788* (2013.01); *C08K 3/30* (2013.01);
 (Continued)

(58) Field of Classification Search
 CPC ... G02F 1/133621; G02F 2001/133614; C09K 11/88; C09K 11/56; C09K 11/025;
 (Continued)

(56) References Cited

U.S. PATENT DOCUMENTS

2012/0011367 A1  1/2012  Denison
2012/0113672 A1*  5/2012  Dubrow ................. B82Y 20/00
                                                                  362/602

(Continued)

FOREIGN PATENT DOCUMENTS

JP  2013-505347 A  2/2013
JP  2013-544018 A  12/2013
JP  2015-153887 A  8/2015

OTHER PUBLICATIONS

International Search Report issued in connection with International Patent Application No. PCT/JP2015/006066 dated Mar. 22, 2016.
(Continued)

*Primary Examiner* — Charles Chang
(74) *Attorney, Agent, or Firm* — Edwards Neils LLC; Jean C. Edwards, Esq.

(57) ABSTRACT

The invention provides a wavelength conversion member including a wavelength conversion layer which includes a second cured product and a first cured product dispersed as spheres in the second cured product, the first cured product being obtained by curing a first polymerizable composition including a quantum dot and a first polymerizable compound, and the second cured product being obtained by curing a second polymerizable composition including a second polymerizable compound. The invention further provides a backlight unit and a liquid crystal display device including the wavelength conversion member.

13 Claims, 5 Drawing Sheets

(51) Int. Cl.
| | |
|---|---|
| *F21V 9/30* | (2018.01) |
| *C09K 11/08* | (2006.01) |
| *H01L 33/50* | (2010.01) |
| *C08K 3/30* | (2006.01) |
| *C08K 9/10* | (2006.01) |
| *C09K 11/02* | (2006.01) |
| *C09K 11/56* | (2006.01) |
| *C09K 11/88* | (2006.01) |
| *F21V 8/00* | (2006.01) |
| *B29D 11/00* | (2006.01) |

(52) U.S. Cl.
CPC ............... *C08K 9/10* (2013.01); *C09K 11/02* (2013.01); *C09K 11/025* (2013.01); *C09K 11/08* (2013.01); *C09K 11/56* (2013.01); *C09K 11/88* (2013.01); *C09K 11/883* (2013.01); *F21V 9/30* (2018.02); *G02B 6/005* (2013.01); *H01L 33/50* (2013.01); *C08K 2003/3036* (2013.01); *C08K 2201/011* (2013.01); *G02F 2001/133614* (2013.01)

(58) Field of Classification Search
CPC ....... C09K 11/883; C09K 11/08; C09K 11/02; F21V 9/30; H01L 33/50; C08K 3/30; C08K 9/10; C08K 2003/3036; C08K 2201/011; G02B 6/005; B29D 11/00788
See application file for complete search history.

(56) References Cited

U.S. PATENT DOCUMENTS

| | | | |
|---|---|---|---|
| 2013/0265522 A1* | 10/2013 | Jung | ................... G02F 1/1336 349/61 |
| 2015/0179900 A1 | 6/2015 | Pickett et al. | |
| 2015/0300600 A1 | 10/2015 | Dubrow et al. | |

OTHER PUBLICATIONS

Written Opinion issued in connection with International Patent Application No. PCT/JP2015/006066 dated Mar. 22, 2016.
Office Action, issued by the Japanese Patent Office (JPO) dated Feb. 6, 2018, in connection with Japanese Patent Application No. 2014-249955.

* cited by examiner

WAVELENGTH CONVERSION MEMBER, BACKLIGHT UNIT, AND LIQUID CRYSTAL DISPLAY DEVICE

CROSS-REFERENCE TO RELATED APPLICATIONS

This application is a continuation application of International Application No. PCT/JP2015/006066, filed Dec. 7, 2015, which was published under PCT Article 21(2) in Japanese, the disclosure of which is incorporated herein by reference in its entirety. Further, this application claims priority from Japanese Patent Application No. 2014-249955, filed Dec. 10, 2014, the disclosure of which is incorporated herein by reference in its entirety.

BACKGROUND OF THE INVENTION

1. Field of the Invention

The present invention relates to a wavelength conversion member, a backlight unit, a liquid crystal display device, and a method of manufacturing a wavelength conversion member.

2. Description of the Related Art

A flat panel display such as a liquid crystal display device (hereinafter also referred to as "LCD") has been more widely used as a space-saving image display device having low power consumption. A liquid crystal display device includes at least a backlight unit and a liquid crystal cell and typically further includes a member such as a backlight-side polarizing plate or a visible-side polarizing plate.

In the flat panel display market, the improvement of color reproducibility has progressed in order to improve the performance of a LCD. Regarding this point, recently, quantum dots (also referred to as QDs) have attracted attention as a light emitting material (refer to US2012/0113672A). For example, in a case where excitation light emitted from a backlight is incident on a wavelength conversion member including quantum dots, the quantum dots are excited to emit fluorescence. Here, by using quantum dots having different light emitting properties to emit various kinds of bright light including red light, green light, and blue light, white light can be realized. Since fluorescence emitted from quantum dots has a small full width at half maximum, the obtained white light has not only high brightness but also excellent color reproducibility. Due to the progress of such a three-wavelength light source technique using quantum dots, the color reproduction range has been widened from 72% to 100% in terms of the current TV standard (full high definition (FHD), National Television System Committee (NTSC)) ratio.

In general, in order to improve the durability of quantum dots, the quantum dots are mixed with a ligand material such that peripheries of the quantum dots are coated with the ligand material. For example, JP2013-544018A discloses a method including: mixing quantum dots with amino polystyrene or polyethyleneimine; curing the mixture; crushing the cured product into clusters; and dispersing the clusters in a polymer material. In addition, JP2013-544018A also discloses a phosphor material which is formed of an amino silicone-epoxy emulsion in which amino silicone is used as a ligand material to be mixed with quantum dots.

According to JP2013-544018A, by imparting light scattering properties to a wavelength conversion member, the optical path length of primary light incident on the wavelength conversion member can be increased, and the use efficiency of the primary light can be improved. Further, JP2013-544018A discloses that the efficiency of a backlight unit into which the wavelength conversion member is incorporated is improved. The clusters described in JP2013-544018A have light scattering properties. Therefore, the wavelength conversion member including the clusters can improve the use efficiency of primary light.

SUMMARY OF THE INVENTION

However, in a case where clusters including quantum dots are unstructured, the light extraction efficiency from the clusters decreases, and there is a problem in that the brightness of a backlight unit or a liquid crystal display device into which the wavelength conversion member is incorporated decreases. It was found that, in the method described in JP2013-544018A, the cured product is crushed, thus the clusters are unstructured and the light extraction efficiency decreases. In order to improve the light extraction efficiency, it is preferable that clusters including quantum dots are substantially spherical.

In addition, recently, reduction in the thickness of a LCD and a backlight unit has progressed, and thus reduction in the thickness of a wavelength conversion member has been also required. Typically, a wavelength conversion member has a thickness of several hundreds of microns, in which a wavelength conversion layer has a thickness of 100 microns or more. Accordingly, in order to reduce the thickness of a wavelength conversion member, it is efficient to reduce the thickness of a wavelength conversion layer. To that end, it is necessary to increase the content of quantum dots in the wavelength conversion layer.

As a result of investigation, the present inventors found that, in a case where the quantum dot concentration in clusters is increased in order to increase the content of quantum dots in a wavelength conversion layer, the emission efficiency of the quantum dots decreases, and the brightness of a backlight unit into which the wavelength conversion member is incorporated decreases. In order to increase the content of quantum dots in a wavelength conversion layer, it is preferable to increase the density of clusters including quantum dots in the wavelength conversion layer rather than to increase the quantum dot concentration in the clusters.

As a result of a thorough investigation, the present inventors found that spherical clusters can be obtained by, for example, mixing and stirring a liquid mixture of quantum dots and amino silicone corresponding to a ligand material with a monomer material such as epoxy as it is to form an emulsion. However, in a case where a monomer is cured to form a film after the formation of clusters, amino silicone as a cluster portion is liquid as it is. Therefore, the strength of the film is low, and it was found that, in a case where the density of the clusters is increased, a wavelength conversion layer is likely to break. As described below, from the viewpoint of preventing deterioration of quantum dots, it is preferable that opposite surfaces of a wavelength conversion layer are in contact with barrier films. However, in a case where the wavelength conversion layer is likely to break, the adhesive strength between the barrier films and the wavelength conversion layer decreases, and the barrier films are likely to peel off.

The present invention has been made in consideration of the above-described circumstances, and an object thereof is to provide a wavelength conversion member which includes a cluster portion including quantum dots, the wavelength conversion member having a sufficient strength despite a small thickness and having a high emission efficiency.

Another object of the present invention is to provide: a backlight unit and a liquid crystal display device which include a wavelength conversion member having a sufficient strength despite a small thickness and having a high emission efficiency; and a method of manufacturing a wavelength conversion member.

As a result of further investigation, the present inventors found that a wavelength conversion member including spherical clusters and having a high strength can be obtained by adding a polymerizable compound to amino silicone, for example, mixing and stirring the mixture with a monomer material to form an emulsion, and curing both a cluster portion and a monomer portion, thereby completing the present invention.

According to the present invention, there is provided a wavelength conversion member, comprising a wavelength conversion layer comprising a quantum dot that emits fluorescence when excited by excitation light, the wavelength conversion layer comprising a second cured product and a first cured product that is dispersed as spheres in the second cured product, the first cured product being obtained by curing a first polymerizable composition comprising the quantum dot and a first polymerizable compound, and the second cured product being obtained by curing a second polymerizable composition comprising a second polymerizable compound.

Here, a spherical shape refers to a true spherical shape or an elliptical shape and preferably a true spherical shape. In the present invention and this specification, sphericity is used as an index for a spherical shape. The sphericity refers to an average value of short diameter/long diameter obtained by measuring short diameters and long diameters of 100 particles using a scanning electron microscope. The upper limit value is 1.00. A short diameter and a long diameter of a particle is a value obtained by observing a cross-section of the wavelength conversion member using a scanning electron microscope to obtain an image of the particle and analyzing the image using an image analysis software WinRoof (manufactured by Mitani Corporation).

It is preferable that a sphericity of the first cured product is 0.94 or higher.

It is preferable that an average particle diameter of the first cured product is from 0.5 to 5 μm.

Here, the average particle diameter is an average value obtained by observing a cross-section of the wavelength conversion member using a scanning electron microscope to obtain images of 100 spherical particles of the first cured product, calculating particle diameters of the 100 particles of the first cured product using an image analysis software WinRoof (manufactured by Mitani Corporation), and obtaining the average value.

The first cured product may be obtained by curing the first polymerizable composition by photopolymerization.

A proportion of the first cured product in the wavelength conversion layer may be 10 vol % or higher and lower than 40 vol %.

It is preferable that the first polymerizable composition includes a compound having a group which is capable of being adsorbed on surfaces of the quantum dots.

It is preferable that the group which is capable of being adsorbed on surfaces of the quantum dots is an amino group.

It is preferable that the first polymerizable composition includes a mixture of the first polymerizable compound, which includes a polysiloxane having, in its molecule, at least a polymerizable group, and a polysiloxane having, in its molecule, at least an amino group.

It is preferable that the first polymerizable composition includes a polysiloxane having, in its molecule, at least an amino group and a polymerizable group.

It is preferable that the second polymerizable compound is at least one selected from the group consisting of epoxy, oxetane, and (meth)acrylate.

It is preferable that at least one surface of the wavelength conversion layer is in contact with a barrier film having an oxygen permeability of $1.00$ $cm^3/(m^2 \cdot day \cdot atm)$ or lower. An oxygen permeability of $1.00$ $cm^3/(m^2 \cdot day \cdot atm)$ or lower corresponds to $1.14 \times 10^{-1}$ fm/Pa·s or lower in SI units.

It is preferable that both surfaces of the wavelength conversion layer are in contact with barrier films having an oxygen permeability of $1.00$ $cm^3/(m^2 \cdot day \cdot atm)$ or lower.

It is preferable that the quantum dots are at least one kind of quantum dots selected from the group consisting of:

quantum dots (A), a center emission wavelength of which is in a wavelength range of from 600 nm to 680 nm;

quantum dots (B), a center emission wavelength of which is in a wavelength range of from 520 nm to 560 nm; and quantum dots (C) having a center emission wavelength of which is in a wavelength range of from 430 nm to 480 nm.

According to the present invention, there is provided a backlight unit comprising:

a light source that emits primary light;

the wavelength conversion member that is provided over the light source;

a retroreflecting member that is disposed so as to face the light source with the wavelength conversion member interposed therebetween; and a reflection plate that is disposed so as to face the wavelength conversion member with the light source interposed therebetween, in which the wavelength conversion member is configured to emit the fluorescence by using, as the excitation light, at least a portion of the primary light emitted from the light source, and to emit secondary light consisting of the fluorescence.

According to the present invention, there is provided a liquid crystal display device comprising at least the backlight unit according to the present invention and a liquid crystal cell.

According to the present invention, there is provided a method of manufacturing a wavelength conversion member including a wavelength conversion layer including a quantum dot that emits fluorescence when excited by excitation light, the method comprising forming the wavelength conversion layer by:

mixing and stirring a first polymerizable composition including the quantum dot and a first polymerizable compound with a second polymerizable composition including a second polymerizable compound so that the first polymerizable composition is dispersed in the second polymerizable composition to form an emulsion; and curing the first polymerizable composition and the second polymerizable composition in the emulsion.

Here, the emulsion refers to a state where the first polymerizable composition including the quantum dot and the first polymerizable compound is dispersed as spheres in the second polymerizable composition.

The first polymerizable composition is photocured, and subsequently the second polymerizable composition may be thermally cured.

According to the present invention, the spherical first cured product including the quantum dots is dispersed in the second cured product. As a result, a wavelength conversion member which has a sufficient strength despite a small thickness of the wavelength conversion layer and having a high emission efficiency can be provided.

DESCRIPTION OF THE PREFERRED EMBODIMENTS

The following description has been made based on a representative embodiment of the present invention. However, the present invention is not limited to the embodiment. In this specification, numerical ranges represented by "to" include numerical values before and after "to" as lower limit values and upper limit values.

In addition, in this specification, "full width at half maximum" of a peak refers to the width of the peak at ½ of the height of the peak. In addition, light having a center emission wavelength in a wavelength range of 430 to 480 nm is called blue light, light having a center emission wavelength in a wavelength range of 520 to 560 nm is called green light, and light having a center emission wavelength in a wavelength range of 600 to 680 nm is called red light.

In this specification, a (meth)acrylate compound or (meth)acrylate represents a compound having one or more (meth)acryloyl groups in one molecule, and a (meth)acryloyl group represents either or both of an acryloyl group and a methacryloyl group. In addition, regarding a (meth)acrylate compound, "monofunctional" represents that one (meth)acryloyl group is included in one molecule, and "polyfunctional" represents that two or more (meth)acryloyl groups are included in one molecule.

In addition, in this specification, epoxy and oxetane represent a compound having at least one epoxy group in one molecule and a compound having at least one oxetane group in one molecule, respectively. Hereinafter, epoxy and oxetane will also be referred to as a compound having an epoxy group or an epoxy compound and a compound having an oxetane group or an oxetane compound, respectively.

<<Wavelength Conversion Member>>

A wavelength conversion member according to the present invention includes a wavelength conversion layer including quantum dots that are excited by excitation light to emit fluorescence, in which in the wavelength conversion layer, a spherical first cured product is dispersed in a second cured product, the first cured product being obtained by curing a first polymerizable composition including the quantum dots and a first polymerizable compound, and the second cured product being obtained by curing a second polymerizable composition including a second polymerizable compound.

Hereinafter, the wavelength conversion member according to the present invention will be described in more detail.

<Configuration and Disposition Example of Wavelength Conversion Member>

The wavelength conversion member has a function of converting the wavelength of at least a portion of incident light to emit light having a different wavelength from that of the incident light The shape of the wavelength conversion member is not particularly limited and may be an arbitrary shape such as a sheet shape or a bar shape. The wavelength conversion member can be used as a component of a backlight unit of a liquid crystal display device.

Figure 1:
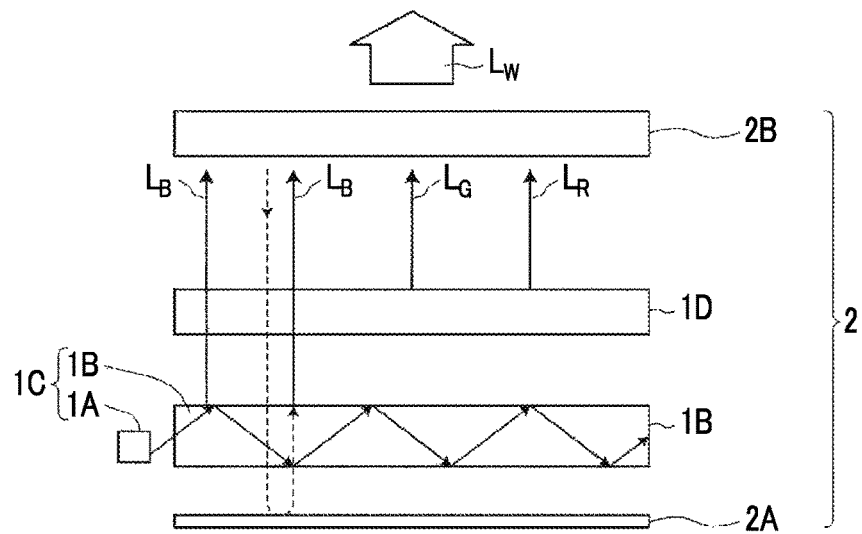
FIG. 1 is a cross-sectional view showing a schematic configuration of an embodiment of a backlight unit including a wavelength conversion member according to the present invention.
Figure 2:
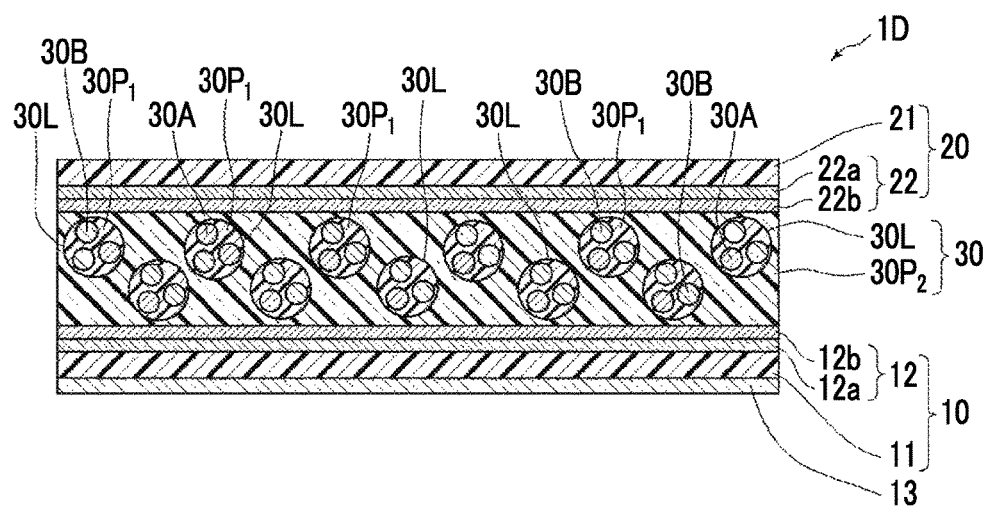
FIG. 2 is a cross-sectional view showing an embodiment of the wavelength conversion member according to the present invention.

A wavelength conversion member according to an embodiment of the present invention and a backlight unit including the wavelength conversion member will be described with reference to the drawings. FIG. 1 is a cross-sectional view showing a schematic configuration of the backlight unit including the wavelength conversion member according to the embodiment. FIG. 2 is a cross-sectional view showing a schematic configuration of the wavelength conversion member according to the embodiment. In the drawings of this specification, dimensions of respective portions are appropriately changed in order to easily recognize the respective portions.

As described above, the backlight unit 2 shown in FIG. 1 includes: a surface light source 1C including a light source 1A, which emits primary light (blue light $L_B$), and a light guide plate 1B which guides and emits the primary light emitted from the light source 1A; a wavelength conversion member 1D that is provided over the surface light source 1C; a retroreflecting member 2B that is disposed so as to face the surface light source 1C with the wavelength conversion member 1D interposed therebetween; and a reflection plate 2A that is disposed so as to face the wavelength conversion member 1D with the surface light source 1C interposed therebetween. The wavelength conversion member 1D is configured to emit the fluorescence by using, as the excitation light, at least a portion of the primary light $L_B$ emitted from the surface light source 1C and to emit secondary light ($L_G$, $L_R$) which includes the fluorescence and the primary light $L_B$ which has passed through the wavelength conversion member 1D. The backlight unit 2 emits white light $L_W$ using the secondary light ($L_G$, $L_R$) and the primary light $L_B$ having passed through the wavelength conversion member 1D.

As shown in FIG. 2, the wavelength conversion member 1D includes: a wavelength conversion layer 30 including quantum dots that emit fluorescence when excited by the excitation light; and supports 11 and 21 that are provided on opposite surfaces of the wavelength conversion layer 30. On surfaces of the supports 11 and 21 on the wavelength conversion layer 30 side, barrier layers 12 and 22 including organic layers 12a and 22a and inorganic layers 12b and 22b are formed in contact with the supports 11 and 21, respectively. In addition, the support 11 includes an unevenness imparting layer 13 which imparts an uneven structure to a surface of the support 11 opposite to the wavelength conversion layer 30 side. In the embodiment, the unevenness imparting layer 13 (mat layer) also functions as a light diffusion layer. The support 11 and the barrier layer 12 constitute a first barrier film 10, and the support 21 and the barrier layer 22 constitute a second barrier film 20.

<Wavelength Conversion Layer>

In the wavelength conversion layer 30, particles 30L are dispersed in an organic matrix $30P_2$. The particles 30L includes: quantum dots 30A that emit the fluorescence (red light) $L_R$ when excited by the blue light $L_B$; quantum dots 30B that emit the fluorescence (green light) $L_G$ when excited by the blue light $L_B$; and a ligand 30P$_1$ that coats peripheries of the quantum dots. The particles 30L are formed of a spherical first cured product which is obtained by curing a first polymerizable composition including the quantum dots and a first polymerizable compound. The ligand 30P$_1$ is obtained by curing the first polymerizable compound. The organic matrix 30P$_2$ is formed of a second cured product which is obtained by curing a second polymerizable composition including a second polymerizable compound. Although described in detail, the wavelength conversion layer can be manufactured by mixing and stirring the first polymerizable composition and the second polymerizable composition with each other and curing the first polymerizable composition and the second polymerizable composition to form an emulsion. The details of the first polymerizable composition and the second polymerizable composition will be described below.

In FIG. 2, the quantum dots 30A and 30B are enlarged and shown in order to easily recognize the quantum dots. Actually, for example, the thickness of the wavelength conversion layer 30 is 50 to 100 μm, and the diameter of the quantum dot is about 2 to 7 nm. The shape of the wavelength conversion layer is not particularly limited and may be an arbitrary shape such as a sheet shape or a bar shape.

Each of the particles 30L may include either or both of the quantum dot 30A that is excited by the blue light $L_B$ to emit the fluorescence (red light) $L_R$ and the quantum dot 30B that is excited by the blue light $L_B$ to emit the fluorescence (green light) $L_G$.

The particles 30L are spherical. Since the particles 30L are spherical, the fluorescence ($L_R$, $L_G$) emitted from the quantum dots can be efficiently extracted. In addition, the light emitted from the particles 30L is efficiently scattered on surfaces of the other particles 30L, and thus the emission efficiency is improved. In addition, the particles 30L are formed of the cured product, and thus a sufficient strength can be obtained even though the wavelength conversion layer is thin.

The sphericity of the particles 30L is preferably 0.8 or higher, more preferably 0.9 or higher, still more preferably 0.94 or higher, and most preferably 1.00 or higher.

In addition, the average particle diameter of the particles 30L is preferably 0.3 to 7 μm and, from the viewpoint of increasing the scattering on the particle surfaces to improve the emission efficiency, is more preferably 0.5 to 5 μm and still more preferably 1 to 5 μm.

The proportion of the cured product of the first polymerizable composition, that is, all the particles 30L in the wavelength conversion layer is preferably 10 vol % or higher and lower than 40 vol % and more preferably 15 vol % or higher and 40 vol % or lower.

(Quantum Dots)

The quantum dots are excited by the excitation light to emit the fluorescence. The wavelength conversion layer includes at least one kind of quantum dots and may include two or more kinds of quantum dots having different light emitting properties. Well-known kinds of quantum dots include quantum dots (A) having a center emission wavelength in a wavelength range of 600 nm to 680 nm, quantum dots (B) having a center emission wavelength in a wavelength range of 520 nm to 560 nm, and quantum dots (C) having a center emission wavelength in a wavelength range of 400 nm to 500 nm. The quantum dots (A) are excited by the excitation light to emit red light, the quantum dots (B) are excited by the excitation light to emit green light, and the quantum dots (C) are excited by the excitation light to emit blue light. For example, in a case where blue light is incident as excitation light on the wavelength conversion layer including the quantum dots (A) and the quantum dots (B), white light can be realized by red light emitted from the quantum dots (A), green light emitted from the quantum dots (B), and blue light having passed through the wavelength conversion member. In addition, in a case where ultraviolet light is incident as excitation light on the wavelength conversion layer including the quantum dots (A), (B), and (C), white light can be realized by red light emitted from the quantum dots (A), green light emitted from the quantum dots (B), and blue light emitted from the quantum dots (C).

In addition to the above description, the details of the quantum dots can be found in, for example, paragraphs "0060" to "0066" of JP2012-169271A, but the present invention is not limited thereto. As the quantum dots, a commercially available product can be used without any particular limitation. The emission wavelength of the quantum dots can be typically adjusted by adjusting the composition of particles, the size of particles, or both the composition and the size of particles.

The quantum dots in the wavelength conversion member according to the present invention are used in a state where they are dispersed in the first polymerizable composition. The quantum dots may be added to the first polymerizable composition in the form of particles or in the form of a dispersion in which they are dispersed in a solvent. It is preferable that the quantum dots are added in the form of a dispersion from the viewpoint of suppressing aggregation of particles of the quantum dots. The solvent used herein is not particularly limited. For example, 0.01 parts by mass to 10 parts by mass of the quantum dots can be added with respect to 100 parts by mass of the total mass of the first polymerizable composition and the second polymerizable composition.

(First Polymerizable Composition)

The first polymerizable composition includes at least the quantum dots and the first polymerizable compound. It is preferable that the first polymerizable composition is not compatible with the second polymerizable composition and has a lower viscosity than the second polymerizable composition. For example, in a case where the composition having the above-described properties is mixed and stirred with the second polymerizable composition, an emulsion is likely to be formed, which is preferable. The viscosity of the first polymerizable composition at 25° C. is preferably 10 to 10000 mPa·s and more preferably 100 to 1000 mPa·s.

In addition, by treating the first polymerizable composition to be hydrophobic and treating the second polymerizable composition to be hydrophilic, the formation of an emulsion can be promoted. As a hydrophobic or hydrophilic index, LogP is used. A high value of LogP represents high hydrophobicity. In a case where the LogP value of a compound is 2.0 or higher, the first polymerizable composition including a large amount (specifically, 70 parts by mass or more with respect to 100 parts by mass of the total amount of the composition) of the compound is hydrophobic. In a case where the LogP value is lower than 2.0, the second polymerizable composition including a large amount of this compound is hydrophilic. In order to form an emulsion, it is preferable that a difference in LogP between the first polymerizable compound and the second polymerizable composition is 3.0 or more.

In the present invention and this specification, the LogP value refers to a logarithm value of a partition coefficient between 1-octanol and water. The LogP value can be obtained by calculation using a fragment method, an atom approach method, or the like.

In addition, as the first polymerizable composition, a compound which is not compatible with a hydrophobic composition and a hydrophilic composition is also preferably used. As the composition, for example, (modified) dimethylpolysiloxane (silicone oil) is particularly preferable.

It is preferable that the first polymerizable composition includes a compound having a group to be adsorbed on surfaces of the quantum dots. This compound adsorbs on surfaces of the quantum dots to function as a ligand such that the dispersibility of the quantum dots in the clusters can be improved and the emission efficiency of the quantum dots can be improved, which is preferable.

As the group to be adsorbed on surfaces of the quantum dots, an amino group, a carboxy group, a mercapto group, a phosphine group, or a phosphine oxide group is preferable, an amino group, a phosphine group, or a phosphine oxide group is more preferable, and an amino group is still more preferable. Examples of the amino group include $-NH_2$, $-NH-$, $-NR^1-$, and $-NR^1R^2$. $R^1$ and $R^2$ each independently represent preferably an alkyl group having 1 to 30 carbon atoms or a cycloalkyl group having 3 to 12 carbon atoms, and more preferably an alkyl group having 1 to 12 carbon atoms or a cycloalkyl group having 3 to 6 carbon atoms.

In order to impart the above-described properties, it is preferable that the first polymerizable composition includes a polysiloxane having at least an amino group in a molecule. It is only necessary that at least one amino group is present at either or both of a molecular chain terminal and a side chain of the polysiloxane. In particular, dimethylpolysiloxane having at least one amino group in a molecule is preferable.

In addition, the compound having a polymerizable group and having a group to be adsorbed on surfaces of the quantum dots can be used as the following first polymerizable compound.

((First Polymerizable Compound in First Polymerizable Composition))

The first polymerizable compound in the first polymerizable composition is not particularly limited as long as it is a compound having a polymerizable group in a molecule. It is preferable that the first polymerizable compound is liquid or oil before being polymerized and has good compatibility with other compounds included in the first polymerizable composition.

Examples of the polymerizable group include an epoxy group, an oxetanyl group, a (meth)acryloyl group, a (meth)acrylamide group, a vinyl group, an allyl group, and a styryl group. Among these, an epoxy group or a (meth)acryloyl group is preferable. It is only necessary that at least one polymerizable group is present at either or both of a molecular chain terminal and a side chain of the first polymerizable compound. By the first polymerizable compound having at least one polymerizable group at a side chain, a stronger wavelength conversion layer can be obtained.

As this compound, for example, epoxy-modified silicone oil, alicyclic epoxy-modified silicone oil, acrylic-modified silicone oil, or methacrylic-modified silicone oil is preferable. Here, alicyclic epoxy (also referred to as aliphatic cyclic epoxy) refers to a monovalent functional group having a cyclic structure in which an epoxy ring and a saturated hydrocarbon ring are condensed. In the present invention, in order to impart oil properties, a silicone having 2000 or less siloxane bonds is preferable. In addition, the weight average molecular weight Mw of the silicone oil is preferably 1000 to 100000 and more preferably 5000 to 20000.

The weight average molecular weight Mw is a weight average molecular weight in terms of polystyrene converted from a value measured by gel permeation chromatography (GPC). As measurement conditions for GPC, for example, the following conditions can be adopted.

GPC device: HLC-8120 (manufactured by Tosoh Corporation)

Column: TSK gel Multipore XL-M (manufactured by Tosoh Corporation, 7.8 mm ID (Inner Diameter)×30.0 cm)

Eluent: tetrahydrofuran (THF)

The first polymerizable composition may include a mixture of a polysiloxane having at least a polymerizable group in a molecule and a polysiloxane having at least an amino group in a molecule.

In addition, it is also preferable that the first polymerizable composition includes a polysiloxane having both an amino group and a polymerizable group in a molecule. Examples of the polysiloxane include modified silicone oil having an amino group and a glycidyl group in a molecule, modified silicone oil having an amino group and an alicyclic epoxy group in a molecule, and modified silicone oil having an amino group and a (meth)acryloyl group in a molecule.

(Photopolymerization Initiator)

It is preferable that the first polymerizable composition includes a photopolymerization initiator. In a case where the first polymerizable composition includes the photopolymerization initiator, the cluster portion can be rapidly cured, for example, by mixing the first polymerizable composition with the second polymerizable composition to form an emulsion and irradiating the emulsion with light such as ultraviolet light. As a result, for example, before the clusters aggregate and coalesce, the clusters can be cured, which is preferable. In addition, this configuration is also preferable from the viewpoint of reducing a variation in the particle diameter distribution of the clusters.

Regarding the photopolymerization initiator, examples of IRGACURE (registered trade name) series which is commercially available from BASF SE include IRGACURE 290, IRGACURE 651, IRGACURE 754, IRGACURE 184, IRGACURE 2959, IRGACURE 907, IRGACURE 369, IRGACURE 379, and IRGACURE 819. In addition, examples of DAROCURE (registered trade name) include DAROCURE TPO and DAROCURE 1173. In addition, examples of ESACURE (registered trade name) which is commercially available from Lamberti S.p.A.) include ESACURE TZM, ESACURE TZT, and ESACURE KT046. In addition, the first polymerizable composition may include a well-known radical polymerization initiator or a well-known cationic polymerization initiator. For example, the details can be found in paragraph "0037" of JP2013-043382A and paragraphs "0040" to "0042" of JP2011-159924A.

The content of the photopolymerization initiator is preferably 0.1 to 10 parts by mass, more preferably 0.2 to 8 parts by mass, and still more preferably 0.2 to 5 parts by mass with respect to 100 parts by mass of the first polymerizable composition.

The first polymerizable composition may include a solvent. The kind and addition amount of the solvent are not particularly limited. For example, as the solvent, one organic solvent or a mixture of two or more organic solvents may be used.

(Second Polymerizable Composition)

The second polymerizable composition includes at least the second polymerizable compound. It is preferable that the second polymerizable composition is not compatible with the first polymerizable composition and has a higher viscosity than the first polymerizable composition. For example, in a case where the composition having the above-described properties is mixed and stirred with the first polymerizable composition, an emulsion is likely to be formed, which is preferable. The viscosity of the second polymerizable composition at 25° C. is preferably 100 to 100000 mPa·s and more preferably 1000 to 20000 mPa·s.

In addition, it is preferable that the oxygen transmission rate of a polymer obtained by curing the second polymerizable composition is low. In a case where the oxygen transmission rate of the polymer is low, deterioration of the quantum dots caused by permeation of oxygen into the polymer can be prevented, which is preferable. Specifically, it is preferable that the oxygen permeability of the polymer per a thickness of 1 mm is 5.00 $cm^3/(m^2 \cdot day \cdot atm)$ or higher.

((Second Polymerizable Compound in Second Polymerizable Composition))

The second polymerizable compound is not particularly limited as long as it is a compound having a polymerizable group in a molecule. As the second polymerizable compound, at least one selected from the group consisting of epoxy, oxetane, and (meth)acrylate is preferable, and epoxy or oxetanyl is more preferable. Epoxy or oxetanyl may be used in combination of (meth)acrylate. In this case, adhesiveness with a substrate is likely to be improved.

—Epoxy—

Examples of the epoxy compound include polyglycidyl esters of polybasic acids, polyglycidyl ethers of polyols, polyglycidyl ethers of polyoxyalkylene glycos, polyglycidyl ethers of aromatic polyols, hydrogenated polyglycidyl ethers of aromatic polyols, urethane-polyepoxy compounds, and epoxidized polybutadienes. Among these compounds, one kind can be used alone, and a mixture of two or more kinds can be used.

Other examples of the epoxy compound which can be preferably used include: an aliphatic cyclic epoxy compound, bisphenol A diglycidyl ether, bisphenol F diglycidyl ether, bisphenol S diglycidyl ether, brominated bisphenol A diglycidyl ether, brominated bisphenol F diglycidyl ether, brominated bisphenol S diglycidyl ether, hydrogenated bisphenol A diglycidyl ether, hydrogenated bisphenol F diglycidyl ether, hydrogenated bisphenol S diglycidyl ether, 1,4-butanediol diglycidyl ether, 1,6-hexanediol diglycidyl ether, glycerin triglycidyl ether, trimethylolpropane triglycidyl ether, polyethylene glycol diglycidyl ether, and polypropylene glycol diglycidyl ether; polyglycidyl ethers of polyether polyols obtained by adding one alkylene oxide or two or more alkylene oxides to an aliphatic polyol such as ethylene glycol, propylene glycol, or glycerin; diglycidyl esters of aliphatic long-chain dibasic acids; monoglycidyl ethers of aliphatic higher alcohols; monoglycidyl ethers of phenol, cresol, butyl phenol, or polyether alcohols obtained by adding an alkylene oxide to phenol, cresol, or butyl phenol; and glycidyl esters of higher fatty acids.

Among these components, an aliphatic cyclic epoxy compound, bisphenol A diglycidyl ether, bisphenol F diglycidyl ether, hydrogenated bisphenol A diglycidyl ether, hydrogenated bisphenol F diglycidyl ether, 1,4-butanediol diglycidyl ether, 1,6-hexanediol diglycidyl ether, glycerin triglycidyl ether, trimethylolpropane triglycidyl ether, neopentyl glycol diglycidyl ether, polyethylene glycol diglycidyl ether, or polypropylene glycol diglycidyl ether is preferable.

Examples of a commercially available product which is preferably used as the compound having an epoxy group or an oxetanyl group include: 828US (manufactured by Mitsubishi Chemical Corporation); UVR-6216 (manufactured by Union Carbide Corporation); GLYCIDOL, AOEX 24, CYCLOMER A200, CELLOXIDE 2021P, and CELLOXIDE 8000, (all of which are manufactured by Daicel Corporation); 4-vinylcyclohexene dioxide (manufactured by Sigma-Aldrich Co. LLC.), EPIKOTE 828, EPIKOTE 812, EPIKOTE 1031, EPIKOTE 872, and EPIKOTE CT 508 (all of which are manufactured by Mitsubishi Chemical Corporation); and KRM-2400, KRM-2410, KRM-2408, KRM-2490, KRM-2720, and KRM-2750 (all of which are manufactured by Adeka Corporation). Among these, one kind can be used alone, or two or more kinds can be used in combination.

In addition, the compound having an epoxy group or an oxetanyl group can be prepared without any particular limitation in the preparation method with reference to, for example, "The Fourth Series of Experimental Chemistry, 20 Organic Synthesis II, pp. 213" (Maruzen-Yushodo Co., Ltd., 1992), "The Chemistry of Heterocyclic Compounds—Small Ring Heterocycles, Part 3 Oxiranes" (Ed. by Alfred Hasfner, John Wiley and Sons, An Interscience Publication, New York, 1985), "Adhesion, Vol. 29, No. 12, 32" (Yoshimura, 1985), "Adhesion, Vol. 30, No. 5, 42" (Yoshimura, 1986), "Adhesion, Vol. 30, No. 7, 42" (Yoshimura, 1986), JP1999-100378A (JP-H11-100378A), JP2906245B, and JP2926262B.

—(Meth)Acrylate—

From the viewpoint of transparency and adhesiveness of the cured coating film, a (meth)acrylate compound such as a monofunctional or polyfunctional (meth)acrylate monomer or a polymer or prepolymer thereof is preferable. In addition, from the viewpoint of suppressing curing shrinkage, a monofunctional (meth)acrylate is more preferable.

—Monofunctional (Meth)Acrylate—

As the monofunctional (meth)acrylate monomer, for example, acrylic acid, methacrylic acid, or a derivative thereof can be used. More specifically, a monomer having one polymerizable unsaturated bond ((meth)acryloyl group) of (meth)acrylic acid in the molecule can be used. Hereinafter, specific examples of the monofunctional (meth)acrylate monomer include the following compounds, but the present invention is not limited thereto.

Examples include: an alkyl (meth)acrylate with an alkyl group having 1 to 30 carbon atoms such as methyl (meth)acrylate, n-butyl (meth)acrylate, isobutyl (meth)acrylate, 2-ethylhexyl (meth)acrylate, isononyl (meth)acrylate, n-octyl (meth)acrylate, lauryl (meth)acrylate, or stearyl (meth)acrylate; an aralkyl (meth)acrylate with an alkyl group having 7 to 20 carbon atoms such as benzyl (meth)acrylate or phenoxy (meth)acrylate; an alkoxyalkyl (meth)acrylate with an alkoxyalkyl group having 2 to 30 carbon atoms such as butoxyethyl (meth)acrylate; an aminoalkyl (meth)acrylate with a (monoalkyl or dialkyl)aminoalkyl group having 1 to 20 carbon atoms in total such as N,N-dimethylaminoethyl (meth)acrylate; a polyalkylene glycol alkyl ether (meth)acrylate with an alkylene chain having 1 to 10 carbon atoms and a terminal alkyl ether having 1 to 10 carbon atoms such as diethylene glycol ethyl ether (meth)acrylate, triethylene glycol butyl ether (meth)acrylate, tetraethylene glycol monomethyl ether (meth)acrylate, hexaethylene glycol monomethyl ether (meth)acrylate, octaethylene glycol monomethyl ether (meth)acrylate, nonaethylene glycol monomethyl ether (meth)acrylate, dipropylene glycol monomethyl ether (meth)acrylate, heptapropylene glycol monomethyl ether (meth)acrylate, or tetraethylene glycol monoethyl ether (meth)acrylate; a polyalkylene glycol aryl ether (meth)acrylate with an alkylene chain having 1 to 30 carbon atoms and a terminal aryl ether having 6 to 20 carbon atoms such as hexaethylene glycol phenyl ether (meth) acrylate; a (meth)acrylate having an alicyclic structure and having 4 to 30 carbon atoms in total such as cyclohexyl (meth)acrylate, dicyclopentanyl (meth)acrylate, isobornyl (meth)acrylate, or a methylene oxide adduct of cyclodecatriene (meth)acrylate; a fluorinated alkyl(meth)acrylate having 4 to 30 carbon atoms in total such as heptadecafluorodecyl (meth)acrylate; a (meth)acrylate having a hydroxyl group such as 2-hydroxyethyl (meth)acrylate, 3-hydroxypropyl (meth)acrylate, 4-hydroxybutyl (meth)acrylate, triethylene glycol mono(meth)acrylate, tetraethylene glycol mono(meth)acrylate, hexaethylene glycol mono(meth)acrylate, octapropylene glycol mono(meth)acrylate, or glycerol mono(meth)acrylate or di(meth)acrylate; a (meth)acrylate having a glycidyl group such as glycidyl (meth)acrylate; a polyethylene glycol mono(meth)acrylate with an alkylene chain having 1 to 30 carbon atoms such as tetraethylene glycol mono(meth)acrylate, hexaethylene glycol mono (meth)acrylate, or octapropylene glycol mono(meth)acrylate; and a (meth)acrylamide such as (meth)acrylamide, N,N-dimethyl (meth)acrylamide, N-isopropyl (meth)acrylamide, 2-hydroxyethyl (meth)acrylamide, or acryloylmorpholine.

From the viewpoint of adjusting the viscosity of the mixture to be in a preferable range, the amount of the monofunctional (meth)acrylate monomer used is preferably 10 parts by mass or more and more preferably 10 to 90 parts by mass with respect to 100 parts by mass of the total mass of the mixture of the first polymerizable composition and the second polymerizable composition.

—Bifunctional (Meth)Acrylate—

A bifunctional (meth)acrylate is preferable from the viewpoint of reducing the viscosity of the composition. In the present invention, a (meth)acrylate compound having excellent reactivity and having no problem of a residual catalyst or the like is preferable.

In particular, for example, neopentyl glycol di(meth) acrylate, 1,9-nonanediol di(meth)acrylate, dipropylene glycol di(meth)acrylate, tripropylene glycol di(meth)acrylate, tetraethylene glycol di(meth)acrylate, hydroxypivalic acid neopentyl glycol di(meth)acrylate, polyethylene glycol di(meth)acrylate, dicyclopentenyl (meth)acrylate, dicyclopentenyloxyethyl (meth)acrylate, or dicyclopentanyl di(meth)acrylate is preferably used in the present invention.

The amount of the bifunctional (meth)acrylate monomer used is preferably 5 parts by mass or more from the viewpoint of adjusting the viscosity of the mixture to be in a preferable range and is preferably 20 parts by mass or less from the viewpoint of suppressing curing shrinkage with respect to 100 parts by mass of the total mass of the mixture of the first polymerizable composition and the second polymerizable composition.

—Trifunctional (Meth)Acrylate—

A trifunctional or higher (meth)acrylate is preferable from the viewpoint of imparting mechanical strength. In the present invention, a (meth)acrylate compound having excellent reactivity and having no problem of a residual catalyst or the like is preferable.

Specifically, ECH-modified glycerol tri(meth)acrylate; EO-modified glycerol tri(meth)acrylate, PO-modified glycerol tri(meth)acrylate, pentaerythritol triacrylate, pentaerythritol tetraacrylate, EO-modified phosphoric acid triacrylate, trimethylolpropane tri(meth)acrylate, caprolactone-modified trimethylolpropane tri(meth)acrylate, EO-modified trimethylolpropane tri(meth)acrylate, PO-modified trimethylolpropane tri(meth)acrylate, tris (acryloxyethyl)isocyanurate, dipentaerythritol hexa(meth) acrylate, dipentaerythritol penta(meth)acrylate, caprolactone-modified dipentaerythritol hexa(meth)acrylate, dipentaerythritol hydroxyenta(meth)acrylate, alkyl-modified dipentaerythritol penta(meth)acrylate, dipentaerythritol poly(meth)acrylate, alkyl-modified dipentaerythritol tri (meth)acrylate, ditrimethylolpropane tetra(meth)acrylate, pentaerythritol ethoxy tetra(meth)acrylate, or pentaerythritol tetra(meth)acrylate is preferable.

Among these, EO-modified glycerol tri(meth)acrylate, PO-modified glycerol tri(meth)acrylate, trimethylolpropane tri(meth)acrylate, EO-modified trimethylolpropane tri (meth)acrylate, PO-modified trimethylolpropane tri(meth) acrylate, dipentaerythritol hexa(meth)acrylate, dipentaerythritol penta(meth)acrylate, pentaerythritol ethoxy tetra(meth) acrylate, or pentaerythritol tetra(meth)acrylate is more preferable in the present invention.

The amount of the polyfunctional (meth)acrylate monomer used is preferably 5 parts by mass or more from the viewpoint of increasing the coating film strength of the quantum dot-containing layer after curing and is preferably 20 parts by mass or less from the viewpoint of suppressing curing shrinkage with respect to 100 parts by mass of the total mass of the mixture of the first polymerizable composition and the second polymerizable composition.

As a preferable combination of the first polymerizable compound with the second polymerizable compound, a combination of amino-modified silicone, epoxy-modified silicone, or acrylic-modified silicone with an epoxy compound or an alicyclic epoxy compound is preferable.

The content of the first polymerizable composition is preferably 10 to 50 parts by mass, more preferably 15 to 45 parts by mass, and still more preferably 20 to 40 parts by mass with respect to 100 parts by mass of the total mass of the first polymerizable composition and the second polymerizable composition.

((Additives))

Optionally, for example, a photopolymerization initiator, a curing agent, a viscosity adjuster, a solvent, or a coupling agent may be added to the second polymerizable composition. Examples of the photopolymerization initiator added to the second polymerizable composition or the emulsion are the same as described above regarding the first polymerizable composition. The addition amount of the photopolymerization initiator is preferably 0.1 to 10 parts by mass, more preferably 0.2 to 8 parts by mass, and still more preferably 0.2 to 5 parts by mass with respect to 100 parts by mass of the second polymerizable composition.

The additives may be added to the second polymerizable composition in advance before mixing the second polymerizable composition with the first polymerizable composition to form an emulsion, or may be added after mixing the first polymerizable composition and the second polymerizable composition to form an emulsion.

In a case where the second polymerizable compound includes epoxy or oxetane, an epoxy curing agent is preferable as an additive. In this case, the addition amount of the epoxy curing agent is preferably 0.1 to 50 parts by mass, more preferably 0.2 to 40 parts by mass, and still more preferably 0.2 to 30 parts by mass with respect to 100 parts by mass of the total mass of the mixture of the emulsion and the epoxy curing agent.

In a case where the second polymerizable compound includes (meth)acrylate, a radical polymerization initiator is preferable as an additive. In this case, the addition amount of the radical polymerization initiator is preferably 0.01 to 10 parts by mass, more preferably 0.5 to 8 parts by mass, and still more preferably 1.0 to 5 parts by mass with respect to 100 parts by mass of the total mass of the mixture of the emulsion and the radical polymerization initiator.

—Epoxy Curing Agent—

In a case where the second polymerizable compound includes epoxy or oxetane, an epoxy curing agent is preferable as a curing agent of the second polymerizable compound. Examples of the epoxy curing agent include organic acid dihydrazide compounds, imidazoles and derivatives thereof, dicyandiamides, aromatic amines, polycarboxylic acids, and polycarboxylic anhydrides. Specific examples include: organic acid dihydrazide compounds such as adipic acid dihydrazide or 1,3-bis-(hydrazinocarboethyl)-5-isopropylhydantoin; imidazole derivatives such as 2,4-diamino-6-[2'-ethylimidazolyl-(1')]-ethyltriazine, 2-phenylimidazole, 2-phenyl-4-methylimidazole, or 2-phenyl-4-methyl-5-hydroxymethylimidazole; dicyandiamides such as dicyandiamide; polycarboxylic acids such as trimellitic acid; and polycarboxylic anhydrides such as phthalic anhydride, trimellitic anhydride, or 1,2,4-cyclohexanetricarboxylic acid-1,2-anhydride. Among these, trimellitic acid or 1,2,4-cyclohexanetricarboxylic acid-1,2-anhydride is preferable from the viewpoint of obtaining excellent transparency. Examples of a commercially available product include ST13 (manufactured by Mitsubishi Chemical Corporation) and 4,7,10-trioxa-1,13-tridecanediamine (manufactured by Sigma-Aldrich Co., Llc.).

As the epoxy curing agent, one kind may be used alone, or a mixture of two or more kinds may be used.

—Viscosity Adjuster—

By adding a viscosity adjuster to the second polymerizable composition, the viscosity thereof can be adjusted to a desired value. It is preferable that the viscosity adjuster is a filler having a particle diameter of 5 nm to 300 nm. In addition, the viscosity adjuster may be a thixotropic agent. In the present invention and this specification, thixotropy refers to a property in which the viscosity of a liquid composition decreases along with an increase in shear rate, and the thixotropic agent refers to a material which has a function of imparting thixotropy to a liquid composition when added to the liquid composition. Specific examples of the thixotropic agent include fumed silica, alumina, silicon nitride, titanium dioxide, calcium carbonate, zinc oxide, talc, mica, feldspar, kaolinite (kaolin clay), pyrophyllite (pyrophyllite clay), sericite, bentonite, smectite and vermiculite (for example, montmorillonite, beidellite, nontronite, or saponite), organic bentonite, and organic smectite. The viscosity adjuster may be added to the first polymerizable composition.

—Solvent—

The second polymerizable composition may include a solvent. The kind and addition amount of the solvent are not particularly limited. For example, as the solvent, one organic solvent or a mixture of two or more organic solvents may be used.

—Coupling Agent—

Regarding the second polymerizable composition, in order to improve adhesiveness between the wavelength conversion layer and a layer adjacent thereto, either or both of the wavelength conversion layer and the layer adjacent thereto may include an organic metal coupling agent. As the organic metal coupling agent, various coupling agents such as a silane coupling agent, a titanium coupling agent, a zirconium coupling agent, an aluminum coupling agent, or a tin coupling agent can be used. It is more preferable that the layer adjacent to the wavelength conversion layer is a layer formed of an inorganic material such as a metal, a metal oxide, or a metal nitride or is a layer including the above inorganic material in a resin because the organic metal coupling agent exhibits a higher adhesion improving effect.

Examples of the silane coupling agent include vinyltrichlorosilane, vinyl trimethoxysilane, vinyltriethoxysilane, 2-(3,4-epoxycyclohexyl)ethyltrimethoxysilane, 3-glycidoxypropyltrimethoxysilane, 2-(3,4-epoxycyclohexyl)ethyltrimethoxysilane, 3-glycidoxypropyltrimethoxysilane, 3-glycidoxypropylmethyldiethoxysilane, 3-glycidoxypropyltriethoxysilane, p-styryltrimethoxysilane, 3-methacryloxypropylmethyldimethoxysilane, 3-methacryloxypropyltrimethoxysilane, 3-methacryloxypropylmethyldiethoxysilane, 3-methacryloxypropyltriethoxysilane, 3-acryloxypropyltrimethoxysilane, N-2-(aminoethyl)-3-aminopropylmethyldimethoxysilane, N-2-(aminoethyl)-3-aminopropyltrimethoxysilane, N-2-(aminoethyl)-3-aminopropyltriethoxysilane, 3-aminopropyltrimethoxysilane, 3-aminopropyltriethoxysilane, 3-triethoxysilyl-N-(1,3-dimethyl-butylidene)propylamine and a partial hydrolysate, 3-trimethoxysilyl-N-(1,3-dimethyl-butylidene)propylamine and a partial hydrolysate, N-phenyl-3-aminopropyltrimethoxysilane, 3-mercaptopropylmethyldimethoxysilane, 3-mercaptopropyltrimethoxysilane, and 3-isocyanatepropyltriethoxysilane. Among these, a vinyl-, epoxy-, (meth)acryloyloxy-, amino-, or isocyanate-modified silane coupling agent is preferable, and a (meth)acryloyloxy-modified silane coupling agent is more preferable. Among these, one kind can be used alone, or two or more kinds can be used in combination.

As a commercially available product of the silane coupling agent, for example, products manufactured by Shin-Etsu Chemical Co., Ltd. can be preferably used. Examples of the products manufactured by Shin-Etsu Chemical Co., Ltd. include KBM-502, KBM-503, KBM-5103, KBM-502, KBE-503, KBM-903, and KBM-9103.

In addition, as the silane coupling agent, a silane coupling agent represented by Formula (1) described in JP2013-43382A can also be used. The details can be found in paragraphs "0011" to "0016" of JP2013-43382A.

Examples of the titanium coupling agent include isopropyl triisostearoyl titanate, isopropyl tridecylbenzenesulfonyl titanate, isopropyl tris(dioctylpyrophosphate)titanate, tetraisopropyl bis(dioctylphosphite)titanate, tetraoctyl bis(ditridecylphosphite)titanate, tetra(2,2-diallyloxymethyl)bis (ditridecyl)phosphite titanate, bis(dioctylpyrophosphate) oxyacetate titanate, bis(dioctylpyrophosphate) ethylene titanate, isopropyltrioctanoyl titanate, isopropyl dimethacryl isostearoyl titanate, isopropyl isostearoyl diacryl titanate, isopropyl tri(dioctylphosphate)titanate, isopropyl tricumylphenyl titanate, isopropyl tri(N-aminoethylaminoethyl)titanate, dicumyl phenyloxyacetate titanate, and diisostearoylethylene titanate.

Examples of the zirconium coupling agent include tetra-n-propoxy zirconium, tetra-butoxy zirconium, zirconium tetra acetylacetonate, zirconium dibutoxy bis(acetylacetonate), zirconium tributoxyethyl acetoacetate, and zirconium butoxy acetylacetonate bis(ethylacetoacetate).

Examples of the aluminum coupling agent include aluminum isopropylate, mono sec-butoxyaluminum diisopropylate, aluminum sec-butylate, aluminum ethylate, ethylacetoacetate aluminum diisopropylate, aluminum tris (ethylacetoacetate), alkyl acetoacetate aluminum diisopropylate, aluminum monoacetylacetonate bis(ethylacetoacetate), and aluminum tris(acetylacetoacetate).

As the titanium coupling agent, the zirconium coupling agent, and the aluminum coupling agent described above, a commercially available product or a product synthesized using a well-known method can be used without any particular limitation. The same shall be applied to the tin coupling agent.

By using the second polymerizable composition including the organic metal coupling agent, the wavelength conversion layer including the organic metal coupling agent can be formed. From the viewpoint of further improving the adhesiveness between the wavelength conversion layer and the layer adjacent thereto, the content of the organic metal coupling agent in the emulsion is preferably 1 to 30 parts by mass, more preferably 3 to 30 parts by mass, still more preferably 5 to 25 parts by mass with respect to 100 parts by mass of the total mass of the emulsion excluding the mass of the quantum dots and the solvent.

After treating a surface of the layer adjacent to the wavelength conversion layer with the organic metal coupling agent, the wavelength conversion layer and the layer adjacent thereto are adhered to each other. As a result, the wavelength conversion layer and the layer adjacent thereto can be laminated. The surface treatment can be performed, for example, by coating a surface of an object with an organic metal coupling agent-containing composition containing the organic metal coupling agent and a solvent. In a case where the organic metal coupling agent has a functional group (hydrolyzable group) which is hydrolyzable in the presence of water, water or a mixed solvent of water and an organic solvent is preferable as the solvent. The organic solvent used in combination with water may be, for example, an alcohol but is not limited thereto. In addition, the organic metal coupling agent-containing composition may include an acid in order to promote hydrolysis. The acid may be, for example, acetic acid but is not limited thereto. The amount of the organic metal coupling agent-containing composition, the amount of the solvent, and the contents of optionally added components such as an acid in the organic metal coupling agent-containing composition may be appropriately adjusted. A coating method of the organic metal coupling agent-containing composition is also not particularly limited, and a surface treatment using a roll-to-roll method is preferable from the viewpoint of productivity. Specifically, with a roll-to-roll method using a well-known coater, the organic metal coupling agent-containing composition can be applied to a film including at least a target layer and can be dried. As the layer on which the surface treatment is performed, an inorganic layer is preferable. By performing the surface treatment, the adhesiveness between the inorganic layer and the wavelength conversion layer can be further improved.

The supports 11 and 21, the barrier layers 12 and 22, and the barrier films 10 and 20 will be described in detail in the description of the following method of manufacturing the wavelength conversion member.

<<Method of Manufacturing Wavelength Conversion Member>>

Figure 3:
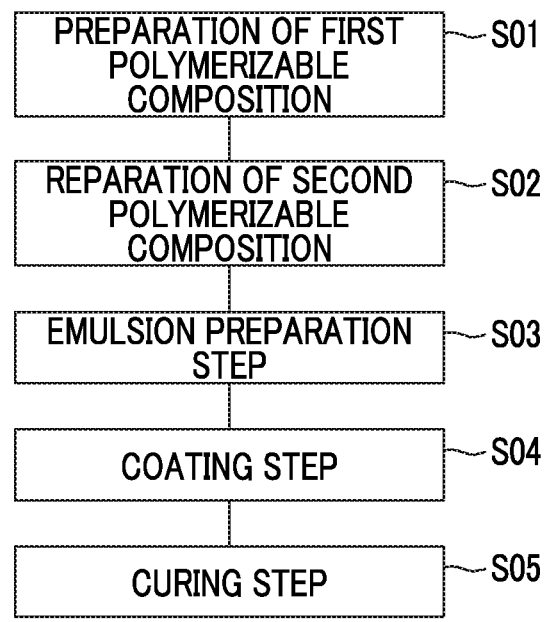
FIG. 3 is a flowchart showing steps of manufacturing a wavelength conversion layer in the wavelength conversion member according to the present invention.

Next, the method of manufacturing the wavelength conversion member according to the present invention will be described. First, the manufacturing of the wavelength conversion layer will be described with reference to FIG. 3. FIG. 3 is a flowchart showing steps of manufacturing the wavelength conversion layer.

The wavelength conversion layer in the wavelength conversion member according to the present invention is formed through a step of mixing and stirring a first polymerizable composition including the quantum dots and a first polymerizable compound with a second polymerizable composition including a second polymerizable compound, a step of dispersing the first polymerizable composition in the second polymerizable composition to form an emulsion, and a step of curing the first polymerizable composition and the second polymerizable composition.

The wavelength conversion layer is manufactured through the manufacturing steps shown in FIG. 3. As shown in FIG. 3, the first polymerizable composition is prepared using the above-described compound (S01). Next, the second polymerizable composition is prepared using the above-described compound (S02). Next, the first polymerizable composition and the second polymerizable composition are mixed and stirred to prepare an emulsion (mixture) (S03). Next, the emulsion is applied to the support and the like using a well-known coating method (S04). Next, the applied emulsion is cured (S05).

The emulsion can be prepared by mixing and stirring the first polymerizable composition and the second polymerizable composition using a well-known stirrer. As the stirrer, for example, a planetary stirrer (MAZERUSTAR KK-250S, manufactured by Kurabo Industries Ltd.) can be used.

The stirring temperature, the stirring time, and the stirring rate can be more appropriately adjusted based on the materials and viscosity of the compositions and the desired particle diameter. The stirring temperature is preferably 0° C. to 150° C. and more preferably 60° C. to 120° C. The stirring time is preferably 1 minute or longer. In addition, regarding the stirring rate, the rotation speed of a stirring blade of the stirrer is preferably 5 rpm or higher.

In the step (S05) of curing the first polymerizable composition and the second polymerizable composition, the first polymerizable composition and the second polymerizable composition may be simultaneously cured, or any one of the first polymerizable composition and the second polymerizable composition may be cured first. From the viewpoint of densifying the wavelength conversion layer to improve the strength, it is preferable that the first polymerizable composition is cured first. In particular, in consideration of the materials constituting the emulsion, it is preferable that, the first polymerizable composition is photocured, and subsequently the second polymerizable composition is thermally cured.

In order to cure the first polymerizable composition, for example, before causing particles of the emulsion to aggregate and coalesce, the first polymerizable composition is cured within preferably 120 minutes and more preferably 60 minutes after the formation of the emulsion.

In a case where the first polymerizable composition is photocured, the irradiation energy dose is preferably 10 mJ/cm$^2$ to 10000 mJ/cm$^2$ and more preferably 100 mJ/cm$^2$ to 4000 mJ/cm$^2$.

In addition, in a case where the second polymerizable composition is thermally cured, the temperature is preferably 40° C. to 150° C. and more preferably 60° C. to 120° C.

Examples of a coating method of the emulsion include various coating methods such as a curtain coating method, a dip coating method, a spin coating method, a printing coating method, a spray coating method, a slot coating method, a roll coating method, a slide coating method, a blade coating method, a gravure coating method, or a wire bar method.

Curing conditions can be appropriately set depending on the kind of the polymerizable compound used and the composition of the polymerizable composition. In addition, in a case where the emulsion includes a solvent, a drying treatment may be performed to remove the solvent before curing.

The emulsion may be cured in a state where it is interposed between two supports.

Here, a configuration of the steps of manufacturing the wavelength conversion member including the coating step (S04) and the curing step (S05) will be described with reference to FIGS. 4 and 5. However, the present invention is not limited to the following configuration. In the embodiment, the first polymerizable composition includes the first polymerizable compound to be photopolymerized, and the second polymerizable composition includes the second polymerizable compound to be thermally cured. In the embodiment, the configuration in which the emulsion is cured by photocuring the first polymerizable composition using a light irradiating device and thermally curing the second polymerizable composition using a heater will be described.

Figure 4:
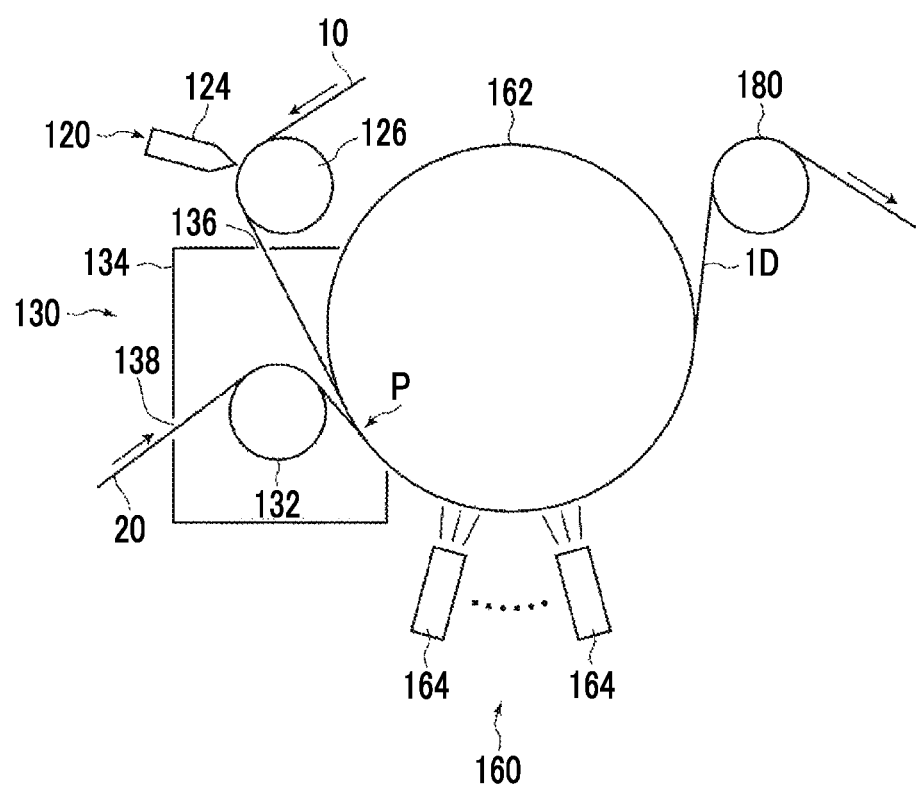
FIG. 4 is a diagram showing a schematic configuration of a manufacturing device for manufacturing the wavelength conversion member according to the present invention.
Figure 5:
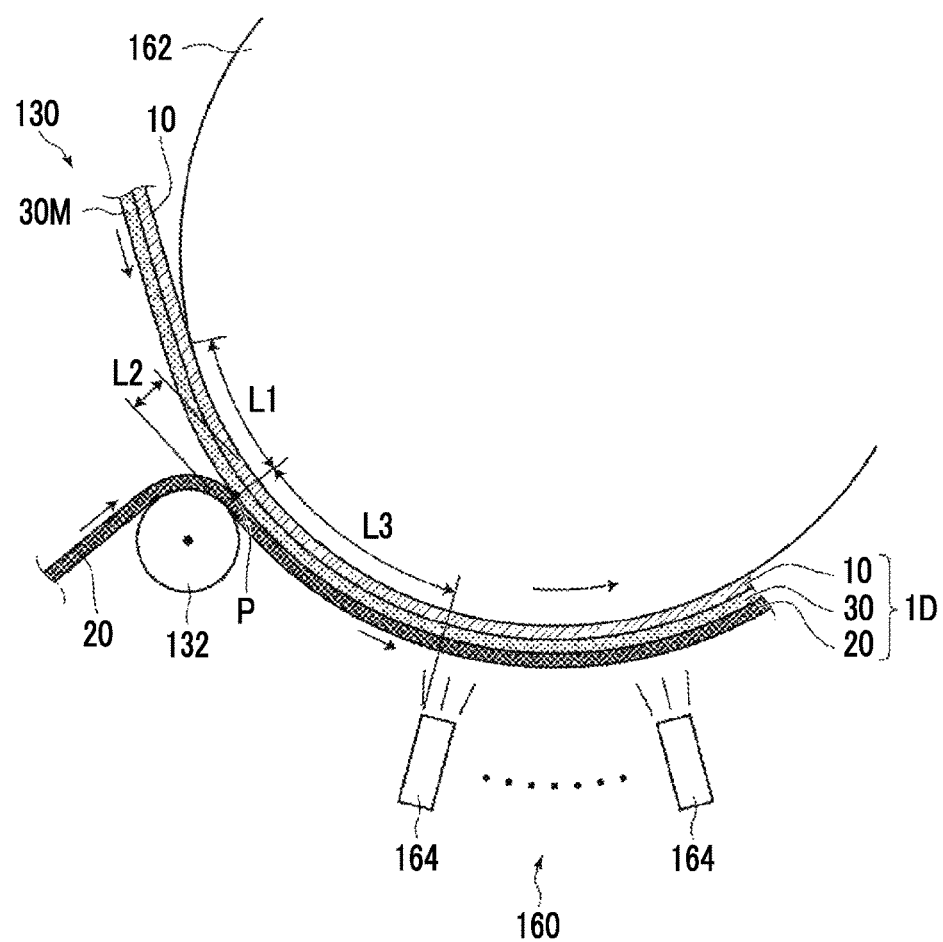
FIG. 5 is an enlarged view showing a part of the manufacturing device shown in FIG. 4.

FIG. 4 is a diagram showing a schematic configuration of an example of a device of manufacturing the wavelength conversion member 1D. FIG. 5 is an enlarged view showing a part of the manufacturing device shown in FIG. 4. Steps of manufacturing the wavelength conversion member using the manufacturing device shown in FIGS. 4 and 5 include at least: a step of forming a coating film by applying a quantum dot-containing polymerizable composition to a surface of the first barrier film 10 (hereinafter, referred to as "first film 10") which is continuously transported; a step of interposing the coating film between the first film 10 and the second film 20 by laminating the second barrier film 20 (hereinafter, referred to as "second film 20"), which is continuously transported, on the coating film; and a step of forming the wavelength conversion layer (cured layer) by winding any one of the first film 10 and the second film 20 around a backup roller in a state where the coating film is interposed between the first film 10 and the second film 20, and irradiating the coating film with light to be cured and polymerized while being continuously transported. By using a barrier film having barrier properties against oxygen and water as any one of the first film 10 and the second film 20, a wavelength conversion member whose single surface is protected by the barrier film can be obtained. In addition, by using the barrier film as each of the first film 10 and the second film 20, the wavelength conversion member 1D in which opposite surfaces of the wavelength conversion layer are protected by the barrier films can be obtained.

More specifically, first, the first film 10 is continuously transported from a transporter (not shown) to a coating portion 120. The first film 10 is transported from the transporter at a transport speed of, for example, 1 to 50 m/min. In this case, the transport speed is not limited to the above value. During the transportation, for example, a tension of 20 to 150 N/m and preferably 30 to 100 N/m is applied to the first film 10.

In the coating portion 120, the emulsion (hereinafter, also referred to as "coating solution") prepared using the first polymerizable composition and the second polymerizable composition is applied to a surface of the first film 10, which is continuously transported, to form a coating film 30M (refer to FIG. 5) thereon. In the coating portion 120, for example, a die coater 124 and a backup roller 126 which is disposed to face the die coater 124 are provided. A surface of the first film 10 opposite to the surface on which the coating film 30M is formed is wound around the backup roller 126, and the coating solution is applied from a jetting port of the die coater 124 to the surface of the first substrate 10 which is continuously transported, to form the coating film 30M thereon. Here, the coating film 30M refers to the emulsion which is applied to the first film 10 and is not cured.

In the embodiment, the die coater 124 to which an extrusion coating method is applied is used as a coating device, but the present invention is not limited thereto. For example, coating devices to which various methods such as a curtain coating method, a rod coating method, or a roll coating method are applied can be used.

The first film 10 which has passed through the coating portion 120 and on which the coating film 30M is formed is continuously transported to a laminating portion 130. In the laminating portion 130, the second film 20 which is continuously transported is laminated on the coating film 30M such that the coating film 30M is interposed between the first film 10 and the second film 20.

In the laminating portion 130, a laminating roller 132 and a heating chamber 134 which surrounds the laminating roller 132 are provided. In the heating chamber 134, an opening 136 through which the first film 10 passes and an opening 138 through which the second film 20 passes are provided.

At a position opposite to the laminating roller 132, a backup roller 162 is disposed. The first film 10 on which the coating film 30M is formed is continuously transported to a laminating position P in a state where a surface opposite to the surface on which the coating film 30M is formed is wound around the backup roller 162. The laminating position P refers to a position where contact between the second film 20 and the coating film 30m starts. It is preferable that the first film 10 is wound around the backup roller 162 before reaching the laminating position P. The reason for this is that, even in a case where wrinkles are formed in the first film 10, the wrinkles are corrected and removed by the backup roller 162 before reaching the laminating position P. Therefore, it is preferably that a distance L1 from a position (contact position) where the first film 10 is wound around the backup roller 162 to the laminating position P is long. For example, the distance L1 is preferably 30 mm or longer, and the upper limit value thereof is typically determined based on a diameter and a pass line of the backup roller 162.

In the embodiment, the second film 20 is laminated by the backup roller 162 which is used in a curing portion 160 and the laminating roller 132. That is, the backup roller 162 which is used in the curing portion 160 also functions as a roller used in the laminating portion 130. However, the present invention is not limited to this configuration. A laminating roller other than the backup roller 162 may be provided in the laminating portion 130 such that the backup roller 162 does not function as a roller used in the laminating portion 130.

By using the backup roller 162, which is used in the curing portion 160, in the laminating portion 130, the number of rollers can be reduced. In addition, the backup roller 162 can also be used as a heat roller for heating the first film 10.

The second film 20 transported from a transporter (not shown) is wound around the laminating roller 132 and is continuously transported between the laminating roller 132 and the backup roller 162. At the laminating position P, the second film 20 is laminated on the coating film 30M formed on the first film 10. As a result, the coating film 30M is interposed between the first film 10 and the second film 20. Laminating described herein represents that the second film 20 is laminated on the coating film 30M.

It is preferable that a distance L2 between the laminating roller 132 and the backup roller 162 is more than the total thickness of the first film 10, the wavelength conversion layer (cured layer) 30 obtained by curing the coating film 30M, and the second film 20. In addition, it is preferable that L2 is equal to or less than a length obtained by adding 5 mm to the total thickness of the first film 10, the coating film 30M, and the second film 20. By adjusting the distance L2 to be equal to or less than the length obtained by adding 5 mm to the total thickness, permeation of bubbles into a gap between the second film 20 and the coating film 30M can be prevented. Here, the distance L2 between the laminating roller 132 and the backup roller 162 refers to the shortest distance between the outer circumferential surface of the laminating roller 132 and the outer circumferential surface of the backup roller 162.

Regarding the rotational accuracy of the laminating roller 132 and the backup roller 162, the radial run-out is 0.05 or less and preferably 0.01 or less. As the radial run-out decreases, the thickness distribution of the coating film 30M can be reduced.

In addition, in order to suppress thermal deformation after the coating film 30M is interposed between the first film 10 and the second film 20, a difference between the temperature of the backup roller 162 and the temperature of the first film 10 in the curing portion 160 and a difference between the temperature of the backup roller 162 and the temperature of the second film 20 are preferably 30° C. or lower, more preferably 15° C. or lower, and still more preferably 0° C.

In a case where the heating chamber 134 is provided in order to reduce the differences from the temperature of the backup roller 162, it is preferable that the first film 10 and the second film 20 are heated in the heating chamber 134. For example, hot air is supplied from a hot air blower (not shown) into the heating chamber 134 such that the first film 10 and the second film 20 can be heated.

The first film 10 may be wound around the backup roller 162 whose temperature is controlled such that the first film 10 is heated by the backup roller 162.

On the other hand, regarding the second film 20, by using a heat roller as the laminating roller 132, the second film 20 can be heated by the laminating roller 132. In this case, the heating chamber 134 and the heat roller are not essential and can be optionally provided.

Next, the coating film 30M is continuously transported to the curing portion 160 while interposed between the first film 10 and the second film 20. In the configuration shown in the drawing, curing in the curing portion 160 is performed by light irradiation. In the curing portion 160, only the first polymerizable composition in the coating film 30M is cured.

At a position opposite to the backup roller 162, a light irradiating device 164 is provided. The first film 10 and the second film 20 between which the coating film 30M is interposed are continuously transported between the backup roller 162 and the light irradiating device 164. Light irradiated by the light irradiating device may be determined depending on the kind of the photopolymerizable compound in the coating film 30M. For example, ultraviolet light is used. Here, the ultraviolet light refers to light in a wavelength range of 280 to 400 nm. As a light source which emits ultraviolet light, for example, a low-pressure mercury lamp, a middle-pressure mercury lamp, a high-pressure mercury lamp, a ultrahigh-pressure mercury lamp, a carbon arc lamp, a metal halide lamp, or a xenon lamp can be used. The irradiation dose may be determined in a range where the polymerization and curing reaction can be performed. For example, the coating film 30M is irradiated with ultraviolet light in an irradiation dose of 100 to 10000 mJ/cm$^2$.

In the curing portion 160, the first film 10 is wound around the backup roller 162 in a state where the coating film 30M is interposed between the first film 10 and the second film 20, and is irradiated with light using the light irradiating device 164 while being continuously transported.

In the embodiment, the first film 10 side is wound around the backup roller 162 and is continuously transported. However, the second film 20 may be wound around the backup roller 162 and may be continuously transported.

"Being around the backup roller 162" represents a state where any one of the first film 10 and the second film 20 is in contact with a surface of the backup roller 162 at a given lap angle. Accordingly, the first film 10 and the second film 20 move in synchronization with the rotation of the backup roller 162 while being continuously transported. Any one of the first film 10 and the second film 20 only has to be wound around the backup roller 162 while at least being irradiated with ultraviolet light.

The backup roller 162 includes a main body having a cylindrical shape and a rotating shaft that is disposed at opposite end portions of the main body. The main body of the backup roller 162 has a diameter φ of, for example, 200 to 1000 mm. The diameter φ of the backup roller 162 is not particularly limited. The diameter φ is preferably 300 to 500 mm from the viewpoints of curling deformation of the laminated film, facility costs, and rotational accuracy.

The second polymerizable composition is thermally cured by heating it using the backup roller 162. The temperature of the backup roller 162 is set to be in a temperature range of, for example, preferably 40° C. to 150° C. and more preferably 60° C. to 120° C. By mounting a temperature controller on the main body of the backup roller 162, the temperature of the backup roller 162 can be controlled. Here, the temperature regarding a roller refers to the surface temperature of the roller.

The coating film 30M is irradiated with light and thermally cured to form the cured layer (the wavelength conversion layer 30), and the wavelength conversion member 1D including the first film 10, the cured layer (the wavelength conversion layer 30), and the second film 20 is manufactured. The wavelength conversion member 1D is peeled off from the backup roller 162 by a peeling roller 180. The wavelength conversion member 1D is continuously transported to a winder (not shown) and then is wound in a roll shape by the winder.

In the embodiment, the case where the thermal curing is simultaneously performed by heating using the backup roller 162 has been described above. However, in a case where the second polymerizable composition is thermally cured after the light irradiation, the second polymerizable composition can be heated and cured, for example, by blowing warm air. A distance L3 between the laminating position P and the light irradiating device 164 can be made to be, for example, 30 mm or more. Alternatively, by providing a heater inside and outside the manufacturing device, the wavelength conversion layer 30 which is transported to the heater may be heated after the light irradiation. As a result, the photocuring and the thermal curing can be sequentially performed.

In addition, the wavelength conversion layer (cured layer) may be prepared by applying the emulsion to the support or the barrier film, laminating an additional substrate thereon, and performing thermal curing and photocuring after drying which is optionally performed. One or more other layers such as an inorganic layer can also be laminated on the prepared wavelength conversion layer using a well-known method.

The thickness of the wavelength conversion layer is preferably in a range of 1 to 300 µm, more preferably in a range of 10 to 200 µm, and still more preferably in a range of 20 to 100 μm. It is preferable that the thickness is 1 μm or more because a high wavelength conversion effect can be obtained. In addition, it is preferable that the thickness is 300 μm or less because, in a case where the wavelength conversion member is incorporated into a backlight unit, the thickness of the backlight unit can be reduced.

(Support)

From the viewpoints of strength improvement, easy film forming, and the like, the wavelength conversion member may include a support. The support may be provided as a layer which is adjacent to or in contact with the wavelength conversion layer, or may be provided as a support of the barrier film described below. In the wavelength conversion member, an inorganic layer described below and the support may be provided in this order, or the wavelength conversion layer, an inorganic layer described below, an organic layer described below, and the support may be provided in this order. The support may be disposed between an organic layer and an inorganic layer, or between two inorganic layers. In addition, one support or two or more supports are provided in the wavelength conversion member, or the wavelength conversion member may have a structure in which the support, the wavelength conversion layer, and the support are laminated. It is preferable that the support is a transparent support which is transparent to visible light. Here, "transparent to visible light" represents that the light transmittance in the visible range is 80% or higher and preferably 85% or higher. The light transmittance used as an index for transparency can be measured using a method described in JIS-K 7105. That is, using an integrating sphere light transmittance measuring device, the total light transmittance and the scattered light amount are measured, and the diffuse transmittance is subtracted from the total light transmittance to obtain the light transmittance. The details of the support can be found in paragraphs "0046" to "0052" of JP2007-290369A and paragraphs "0040" to "0055" of JP2005-096108A. From the viewpoints of gas barrier properties, impact resistance, and the like, the thickness of the support is preferably 10 μm to 500 μm, more preferably 20 to 400 μm, and still more preferably 30 to 300 μm.

The support can also be used as either or both of the first film and the second film. In a case where the supports is used as both of the first film and the second film, the kinds of the supports may be the same as or different from each other.

(Barrier Film)

It is preferable that the wavelength conversion member includes a barrier film. The barrier film is a film having a gas barrier function of blocking oxygen. It is also preferable that the barrier film has a function of blocking water vapor.

It is preferable that the barrier film is provided as a layer which is in direct contact with the wavelength conversion layer in the wavelength conversion member. In addition, one barrier film or two or more barrier films may be provided in the wavelength conversion member. It is preferable that the wavelength conversion member has a structure in which the barrier film, the wavelength conversion layer, and the barrier film are laminated in this order.

In the wavelength conversion member, the wavelength conversion layer may be formed by using the barrier film as a substrate. The barrier film can also be used as either or both of the first film and the second film. In a case where both first film and the second film are barrier films, the kinds of the barrier films used as the first film and the second film may be the same as or different from each other.

The barrier film may be a well-known barrier film or may be, for example, a barrier film described below.

Typically, the barrier film may include a barrier layer including at least an inorganic layer. For example, the barrier film may be a film which includes a support and a barrier layer including an inorganic layer. The barrier film may include a barrier layer which includes at least one inorganic layer and at least one organic layer on the support. It is preferable that multiple layers are laminated as described above because barrier properties can be further improved. On the other hand, as the number of layers laminated increases, the light transmittance of the wavelength conversion member is likely to decrease. Therefore, it is preferable to increase the number of layers laminated in a range where a high light transmittance can be maintained. Specifically, the total light transmittance of the barrier film in the visible range is preferably 80% or higher, and the oxygen permeability thereof is preferably 1.00 $cm^3/(m^2 \cdot day \cdot atm)$ or lower. Here, the oxygen permeability is a value measured using an oxygen permeability measuring device (OX-TRAN 2/20 (trade name), manufactured by Mocon Inc.) under conditions of measurement temperature: 23° C. and relative humidity: 90%. In addition, The visible range refers to a wavelength range of 380 nm to 780 nm, and the total light transmittance refers to an average light transmittance value in the visible range.

The oxygen permeability of the barrier film is more preferably 0.10 $cm^3/(m^2 \cdot day \cdot atm)$ or lower, and still more preferably 0.01 $cm^3/(m^2 \cdot day \cdot atm)$ or lower. The total light transmittance in the visible range is more preferably 90% or higher. The lower the oxygen permeability, the better. In addition, the higher the total light transmittance in the visible range, the better.

((Barrier Layer: Inorganic Layer))

"Inorganic layer" is a layer including an inorganic material as a major component and is preferably a layer consisting only of an inorganic material. On the other hand, "organic layer" is a layer including an organic material as a major component in which the content of the organic material is preferably 50 mass % or higher, more preferably 80 mass % or higher, and still more preferably 90 mass % or higher.

The inorganic material constituting the inorganic layer is not particularly limited, and various inorganic compounds such as a metal, an inorganic oxide, an inorganic nitride, or an inorganic oxynitride can be used. As an element constituting the inorganic material, silicon, aluminum, magnesium, titanium, tin, indium, or cerium is preferable. The inorganic material may include one element or two or more elements among the above elements. Specific examples of the inorganic compound include silicon oxide, silicon oxynitride, aluminum oxide, magnesium oxide, titanium oxide, tin oxide, an indium oxide alloy, silicon nitride, aluminum nitride, and titanium nitride. In addition, as the inorganic layer, a metal film such as an aluminum film, a silver film, a tin film, a chromium film, a nickel film, or a titanium film may be provided.

Among the inorganic materials, silicon nitride, silicon oxide, or silicon oxynitride is more preferable. Since the inorganic layer formed of the above materials has excellent adhesiveness with the organic layer, barrier properties can be further improved.

A method of forming the inorganic layer is not particularly limited. For example, various film forming methods in which a film forming material can be evaporated or scattered to be deposited on a deposition target surface can be used.

Examples of the method of forming the inorganic layer include: a vacuum deposition method of heating and depositing an inorganic material such as an inorganic oxide, an inorganic nitride, an inorganic oxynitride, or a metal; an oxidation deposition method of introducing oxygen gas and oxidizing an inorganic material as a raw material for deposition; a sputtering method of introducing argon gas and oxygen gas and sputtering an inorganic material as a target material for deposition; a physical vapor deposition (PVD) method, such as an ion plating method, of heating an inorganic material with a plasma beam generated by a plasma gun for deposition; and in a case where a deposited film formed of silicon oxide is formed, a chemical vapor deposition (CVD) method of using an organic silicon compound as a raw material. Vapor deposition may be performed on a surface of the support, the wavelength conversion layer, or the organic layer as a substrate.

The thickness of the inorganic layer may be 1 nm to 500 nm and is preferably 5 nm to 300 nm and more preferably 10 nm to 150 nm. By adjusting the thickness of the adjacent inorganic layer to be in the above-described range, light absorption in the inorganic layer can be suppressed while realizing excellent barrier properties, and the wavelength conversion member having a high light transmittance can be provided.

In the wavelength conversion member, it is preferable that the inorganic layer is in direct contact with at least one main surface of the wavelength conversion layer. It is also preferable that the inorganic layer is in direct contact with opposite main surfaces of the wavelength conversion layer. In addition, an inorganic layer and an organic layer, two inorganic layers, or two organic layers may be adhered to each other through an well-known adhesive layer. From the viewpoint of improving light transmittance, it is preferable that the number of adhesive layers is as small as possible, and it is more preferable that no adhesive layer is present. In a configuration, it is preferable that an inorganic layer and an organic layer are in direct contact with each other.

((Barrier Layer: Organic Layer))

The details of the organic layer can be found in paragraphs "0020" to "0042" of JP2007-290369A and paragraphs "0074" to "0105" of JP2005-096108A. It is preferable that the organic layer includes a cardo polymer. As a result, adhesiveness between the organic layer and an adjacent layer, in particular, adhesiveness between the organic layer and the inorganic layer is improved, and more favorable gas barrier properties can be realized. The details of the cardo polymer can be found in paragraphs "0085" to "0095" of JP2005-096108A. The thickness of the organic layer is preferably in a range of 0.05 μm to 10 μm and more preferably in a range of 0.5 to 10 μm. In a case where the organic layer is formed using a wet coating method, the thickness of the organic layer is preferably in a range of 0.5 to 10 μm and more preferably in a range of 1 μm to 5 μm. In a case where the organic layer is formed using a dry coating method, the thickness of the organic layer is preferably in a range of 0.05 μm to 5 μm and more preferably in a range of 0.05 μm to 1 μm. By adjusting the thickness of the organic layer, which is formed using a wet coating method or a dry coating method, adhesiveness with the inorganic layer can be further improved.

Other details of the inorganic layer and the organic layer can be found in JP2007-290369A, JP2005-096108A, and US2012/0113672A1.

(Scattering Particles)

A light scattering function may be imparted to the wavelength conversion member in order to efficiently extract the fluorescence, which is emitted from the quantum dots, from the wavelength conversion layer. The light scattering function may be provided in the wavelength conversion layer, or a layer having a light scattering function may be separately provided as a light scattering layer. It is preferable that the scattering particles are added into the wavelength conversion layer. It is also preferable that a light scattering layer is provided on a surface of the wavelength conversion layer. Scattering on the light scattering layer may depend on the scattering particles or on surface roughness.

(Unevenness Imparting Layer (Mat Layer))

It is preferable that the barrier film includes an unevenness imparting layer (mat layer) which imparts an uneven structure to a surface of the barrier film opposite to the wavelength conversion layer side. In a case where the barrier film includes the mat layer, blocking properties and slipping properties of the barrier film can be improved, which is preferable. It is preferable that the mat layer is layer including particles. Examples of the particles include inorganic particles such as silica, alumina, a metal oxide and organic particles such as crosslinked polymer particles. In addition, it is preferable that the mat layer is provided on a surface of the barrier film opposite to the wavelength conversion layer. However, the mat layer may be provided on opposite surfaces of the barrier film.

<<Backlight Unit>>

As described above, the backlight unit 2 shown in FIG. 1 includes: a surface light source 1C including a light source 1A, which emits primary light (blue light $L_B$), and a light guide plate 1B which guides and emits the primary light emitted from the light source 1A; a wavelength conversion member 1D that is provided on the surface light source 1C; a retroreflecting member 2B that is disposed to face the surface light source 1C with the wavelength conversion member 1D interposed therebetween; and a reflection plate 2A that is disposed to face the wavelength conversion member 1D with the surface light source 1C interposed therebetween. The wavelength conversion member 1D are excited by excitation light, which is at least a portion of the primary light $L_B$ emitted from the surface light source 1C, to emit fluorescence and emits secondary light ($L_G$, $L_R$) which includes the fluorescence and the primary light $L_B$ which does not function as excitation light. Using $L_G$, $L_R$, and $L_B$, the white light $L_W$ is emitted from a surface of the retroreflecting member 2B.

(Emission Wavelength of Backlight Unit)

From the viewpoint of realizing high brightness and high color reproducibility, it is preferable that the backlight unit includes a multi-wavelength light source. For example, it is preferable that blue light having a center emission wavelength in a wavelength range of 430 to 480 nm and having a full width at half maximum of emission peak of 100 nm or less, green light having a center emission wavelength in a wavelength range of 520 to 560 nm and having a full width at half maximum of emission peak of 100 nm or less, and red light having a center emission wavelength in a wavelength range of 600 to 680 nm and having a full width at half maximum of emission intensity peak of 100 nm or less are emitted.

From the viewpoint of further improving brightness and color reproducibility, the wavelength range of the blue light emitted from the backlight unit is more preferably 440 to 460 nm.

From the same viewpoint, the wavelength range of the green light emitted from the backlight unit is more preferably 520 to 545 nm.

In addition, from the same viewpoint, the wavelength range of the red light emitted from the backlight unit is more preferably 610 to 640 nm.

In addition, from the same point, the full width at half maximum of the emission intensity of each of the blue light, the green light, and the red light emitted from the backlight unit is preferably 80 nm or less, more preferably 50 nm or less, still more preferably 40 nm or less, and still more preferably 30 nm or less. In particular, it is more preferable that the full width at half maximum of the emission intensity of the blue light is 25 nm or less.

The backlight unit 2 includes at least the wavelength conversion member 1D and the surface light source 1C. As the light source 1A, for example, a light source which emits blue light having a center emission wavelength in a wavelength range of 430 nm to 480 nm, or a light source which emits ultraviolet light can be used. As the light source 1A, for example, a light emitting diode or a laser light source can be used.

As shown in FIG. 1, the surface light source 1C may include: the light source 1A; and the light guide plate 1B that guides and emits the primary light emitted from the light source 1A. Alternatively, the surface light source 1C may include: the light source 1A that is disposed along with a plane parallel to the wavelength conversion member 1D; and a diffusion plate that is provided instead of the light guide plate 1B. The former light source is called an edge light mode, and the latter light source is called a direct backlight mode.

In a case where a light source emitting blue light is used, the wavelength conversion layer includes at least: the quantum dots (A) that are excited by excitation light to emit red light; and the quantum dots (B) that are excited by excitation light to emit green light. As a result, white light can be realized by blue light, which has been emitted from the light source and has passed through the wavelength conversion member, and red light and green light which have been emitted from the wavelength conversion member.

In addition, in another configuration, a light source (ultraviolet light source) which emits ultraviolet light having a center emission wavelength in a wavelength range of 300 nm to 430 nm, for example, a ultraviolet light emitting diode can be used as the light source. In this case, the wavelength conversion layer includes not only the quantum dots (A) and (B) but also the quantum dots (C) that are excited by excitation light to emit blue light. As a result, white light can be realized by red light, green light, and blue light emitted from the wavelength conversion member.

In addition, in another configuration, a laser light source can also be used instead of a light emitting diode.

In addition, as the reflection plate 2A, a well-known reflection plate can be used without any particular limitation. The details of the reflection plate 2A can be found in JP3416302B, JP3363565B, JP4091978B, and JP3448626B, the contents of which are incorporated herein by reference.

The retroreflecting member 2B may be formed of a well-known diffusion plate, a diffusion sheet, a prism sheet (for example, BEF series, manufactured by Sumitomo 3M Ltd.), or a reflective polarizing film (for example, DBEF series, manufactured by Sumitomo 3M Ltd.). The configuration of the retroreflecting member 2B can be found in JP3416302B, JP3363565B, JP4091978B, and JP3448626B, the contents of which are incorporated herein by reference.

<<Liquid Crystal Display Device>>

Figure 6:
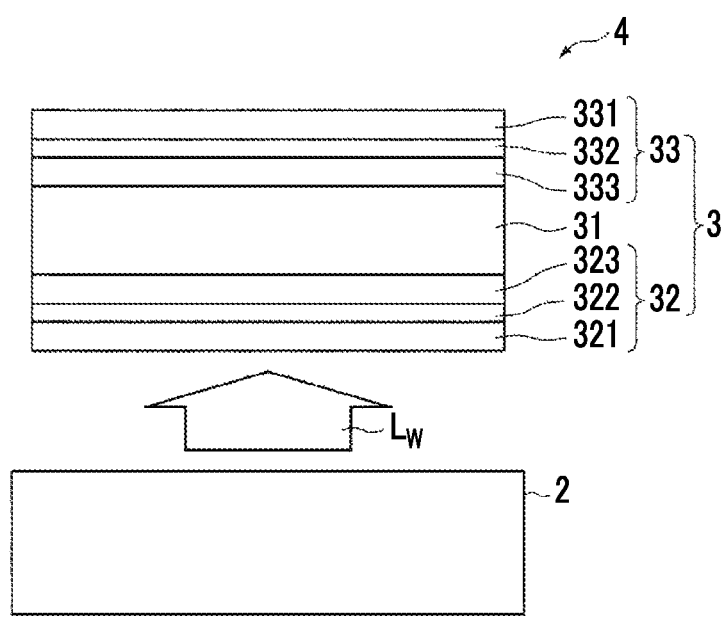
FIG. 6 is a cross-sectional view showing a schematic configuration of an embodiment of a liquid crystal display device according to the present invention.

Next, a liquid crystal display device according to the present invention will be described. FIG. 6 is a cross-sectional view showing a schematic configuration of an embodiment of the liquid crystal display device according to the present invention. The above-described backlight unit 2 can be applied to a liquid crystal display device. As shown in FIG. 6, a liquid crystal display device 4 includes: the backlight unit 2 according to the embodiment; and a liquid crystal cell unit 3 that is disposed to face the retroreflecting member side of the backlight unit 2.

In the liquid crystal cell unit 3, as shown in FIG. 6, a liquid crystal cell 31 is interposed between polarizing plates 32 and 33. In the polarizing plates 32 and 33, opposite main surfaces of polarizers 322 and 332 are protected by polarizing plate protective films 321 and 323 and polarizing plate protective films 331 and 333, respectively.

Regarding each of the liquid crystal cell 31, the polarizing plates 32 and 33, and other components which constitute the liquid crystal display device 4, a product prepared using a well-known method or a commercially available product can be used without any particular limitation. In addition, of course, a well-known interlayer such as an adhesive layer can be provided between respective layers.

As a driving mode of the liquid crystal cell 31, various modes such as a twisted nematic (TN) mode, a super twisted nematic (STN) mode, a vertical alignment (VA) mode, an in-plane switching (IPS) mode, or an optically compensated bend (OCB) mode can be used without any particular limitation. The liquid crystal cell is preferably a VA mode, an OCB mode, an IPS mode, or a TN mode but is not limited thereto. Examples of the configuration of the VA mode liquid crystal display device include a configuration shown in FIG. 2 described in JP2008-262161A. However, a specific configuration of the liquid crystal display device is not particularly limited, and a well-known configuration can be adopted.

Optionally, the liquid crystal display device 4 further includes an optical compensation member for optical compensation or a sub-functional layer such as an adhesive layer. Further, in addition to (or instead of) a color filter substrate, a thin film transistor substrate, a lens film, a diffusion sheet, a hard coat layer, an anti-reflection layer, a low-reflection layer, or an anti-glare layer, a surface layer such as a forward scattering layer, a primer layer, an antistatic layer, or an undercoat layer may be disposed.

The backlight-side polarizing plate 32 may include a phase difference film as the polarizing plate protective film 323 on the liquid crystal cell 31 side. As this phase difference film, for example, a well-known cellulose acylate film can be used.

The backlight unit 2 and the liquid crystal display device 4 includes the wavelength conversion member according to the present invention having a small light loss. Accordingly, the same effects as those of the wavelength conversion member according to the present invention are exhibited, and the backlight unit and the liquid crystal display device have high brightness.

EXAMPLES

Hereinafter, the present invention will be described in detail using examples. Materials, used amounts, ratios, treatment details, treatment procedures, and the like shown in the following examples can be appropriately changed within a range not departing from the scope of the present invention. Accordingly, the scope of the present invention is not limited to the following specific examples.

(Preparation of Barrier Film 10)

As a support, a polyethylene terephthalate film (PET film; trade name: COSMOSHINE (registered trade name) A4300, manufactured by Toyobo Co., Ltd.) having a thickness of 50

μm was used, and an organic layer and an inorganic layer were formed in this order on a single surface of the support in the following procedure.

Trimethylolpropane triacrylate (TMPTA (trade name), manufactured by Daicel-Cytec Co., Ltd.) and a photopolymerization initiator (ESACURE KTO 46 (trade name), manufactured by Lamberti S.p.A.) were prepared and were weighed such that a mass ratio thereof was 95:5. These components were dissolved in methyl ethyl ketone. As a result, a coating solution having solid content concentration of 15% was obtained. This coating solution was applied to the above-described PET film using a roll-to-roll method with a die coater and was allowed to pass through a drying zone at 50° C. for 3 minutes. Next, in a nitrogen atmosphere, the coating solution was irradiated with ultraviolet light (cumulative irradiation dose: about 600 mJ/cm²) to be cured, and the PET film was wound. The thickness of a first organic layer formed on the support was 1 μm.

Next, using a roll-to-roll CVD apparatus, an inorganic layer (silicon nitride layer) was formed on a surface of the organic layer. As raw material gases, silane gas (flow rate: 160 sccm), ammonia gas (flow rate: 370 sccm), hydrogen gas (flow rate: 590 sccm), and nitrogen gas (flow rate: 240 sccm) were used. As a power supply, a high-frequency power supply having a frequency of 13.56 MHz was used. The film forming pressure was 40 Pa, and the achieved thickness was 50 nm. In this way, the barrier film 10 in which the inorganic layer was formed on a surface of the first organic layer formed on the support was prepared.

(Preparation of First Polymerizable Composition Used in Example 1)

As quantum dots 1 having an emission peak of green light, quantum dots manufactured by Sigma-Aldrich Co., Llc. (Product No.: 748056, emission peak wavelength: 540 nm, ligand: octadecylamine) was prepared. In addition, as quantum dots 2 having an emission peak of red light, quantum dots manufactured by Sigma-Aldrich Co., Llc. (Product No.: 790206, emission peak wavelength: 630 nm, ligand: octadecylamine) was prepared.

In a glove box which was purged with nitrogen such that the oxygen concentration was 300 ppm or lower, the quantum dots and compounds shown below were prepared at a mixing ratio shown below and were stirred using a magnetic stirrer for 4 hours in a hot water bath at 90° C. Next, the mixture was filtered through a filter formed of polypropylene having a pore size of 0.2 μm. As a result, a first polymerizable composition 1 used in Example 1 was obtained.

—First Polymerizable Composition 1 Used in Example 1—

Quantum Dots 1: 0.9 parts by mass
Quantum Dots 2: 0.1 parts by mass
Amino-modified silicone (GP-344, manufactured by Genesee Scientific Corporation, viscosity: 670 mPa·s): 90 parts by mass
Epoxy-modified silicone (X-22-163C, manufactured by Shin-Etsu Chemical Co., Ltd., viscosity: 120 mPa·s): 8 parts by mass
Photopolymerization Initiator IRGACURE-PAG-290 (manufactured by BASF SE): 1 part by mass (Synthesis of Modified Silicone Used in Example 6)

200 g of methylhydrosiloxane MS-151 (manufactured by Gelest Inc.), 20 g of allylurea (product code: A0237, manufactured by Tokyo Chemical Industry Co., Ltd.), and 23 g of allyl glycidyl ether (product code: A0221, manufactured by Tokyo Chemical Industry Co., Ltd.) were added to 500 mL of octanol containing 2 mass % of chloroplatinic acid and were caused to react with each other at 90° C. for 10 hours. As a result, the following compound A was obtained.

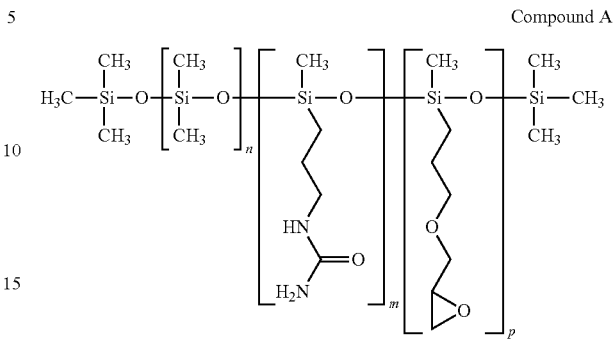

Compound A

In the compound A, n represents an integer of 18 to 22, m represents an integer of 1 to 3, and p represents an integer of 1 to 3.

(Preparation of First Polymerizable Compositions Used in Other Examples and Comparative Examples)

First polymerizable compositions used in other examples and comparative examples were obtained using the same method as in Example 1, except that the quantum dots and compounds were prepared at composition ratios (mass ratios) shown in Table 1, respectively.

(Second Polymerizable Composition)

As a polymerizable compound of a second polymerizable composition used in Example 1, an epoxy monomer (trade name: "828US", manufactured by Mitsubishi Chemical Corporation) was used. In addition, in other Examples and Comparative Examples, polymerizable compounds shown in Table 1 were used, respectively.

(Mixing of First Polymerizable Composition 1 and Second Polymerizable Composition and Preparation of Emulsion)

The first polymerizable composition 1 and the second polymerizable composition used in Example 1 were mixed with each other at a mass ratio of 20:80, and the mixture was stirred at a temperature of 40° C. and a rotation speed of 10 rpm for 1 minute using a stirrer equipped with a propeller blade having a diameter of φ50 mm Next, the mixture was stirred for 10 minutes using a planetary stirrer (trade name: "MAZERUSTAR KK-250S", manufactured by Kurabo Industries Ltd.).

30 parts by mass of an epoxy resin curing agent (trade name: "ST13", manufactured by Mitsubishi Chemical Corporation) was mixed with the 70 parts by mass of the emulsion obtained as described above. Next, the mixture was stirred for 1 minute using a planetary stirrer (MAZERUSTAR KK-250S, manufactured by Kurabo Industries Ltd.). In this way, a mixture 1 used for the preparation of a wavelength conversion member according to Example 1 was obtained.

(Preparation of Emulsions Used in Examples 2 to 6 and Comparative Example 1)

Mixtures used in Examples 2 to 6 and Comparative Example 1 were obtained using the same method as in Example 1, except that the materials and the composition ratio (mass ratios) were changed as shown in Table 1.

(Preparation of Emulsion Used in Comparative Example 2)

The quantum dots, the amino-modified silicone, and the first polymerizable compound were mixed with each other according to materials and a composition ratio (mass ratio) shown in Table 1, and the mixture was heated and cured at 80° C. for 1 hour. Next, the cured product was crushed using a ball mill and was mixed with the second polymerizable composition shown in Table 1 at a weight ratio shown in Table 1. In this way, a mixture used for the preparation of a wavelength conversion member according to Comparative Example 2 was obtained.

(Preparation of Wavelength Conversion Member According to Example 1)

Using the above-described device for manufacturing the wavelength conversion member, the mixture 1 was applied to the inorganic layer surface of the barrier film 10 prepared according to the above-described procedure using a die coater while continuously transporting the barrier film 10 at 1 m/min with a tension of 60 N/m. As a result, a coating film having a thickness of 50 µm was formed. Another barrier film 10 was wound around the backup roller and was laminated on the coating film such that the inorganic layer surface was in contact with the coating film. The laminate was irradiated with ultraviolet light using an air-cooled metal halide lamp (manufactured by Eye Graphics Co., Ltd.) of 160 W/cm while being continuously transported in a state where the coating film was interposed between the two barrier films. Next, the laminate was held at 80° C. for 1 hour to cure epoxy. As a result, a wavelength conversion member according to Example 1 was obtained.

(Preparation of Wavelength Conversion Members According to Other Examples and Comparative Examples)

Wavelength conversion members were prepared using the same method as in Example 1, except that the above-prepared mixtures used in other Examples and Comparative Examples were used. In addition, in Comparative Examples 1 and 2, the laminate was held at 80° C. for 1 hour to cure epoxy instead of being irradiated with ultraviolet light using a metal halide lamp.

Each of the obtained films according to Examples 1 to 6 was cut, images of 100 particles in a cross-section were obtained using a scanning electron microscope, and particle diameters thereof were obtained using an image analysis software WinRoof (manufactured by Mitani Corporation). It was found that the cured product formed of the first polymerizable composition had spherical particles having a particle diameter of about 0.5 to 5 µm. In addition, an average value of short diameter/long diameter was calculated from long diameters and short diameters of the particles. The sphericity was 0.94 to 0.98.

In addition, the film according to Comparative Example 2 was cut, and a cross-sectional image was obtained using a scanning electron microscope, and it was found that the cured product formed of the first polymerizable composition had unstructured particles (long diameter: about 0.3 to 10 µm).

(Evaluation of Film Strength (Adhesive Strength))

The adhesive strength of the wavelength conversion member according to each of Examples and Comparative Examples was measured in a 180° peeling test using a method described in JIS Z 0237.

A: the 180° peeling adhesive strength was 2.0 N/10 mm or higher

B: the 180° peeling adhesive strength was 0.5 N/10 mm or higher

C: the 180° peeling adhesive strength was lower than 0.2 N/10 mm or higher (Evaluation of Brightness)

A commercially available 7-inch tablet terminal (trade name: "Kindle Fire HDX 7", manufactured by Amazon.com Inc.) was disassembled to extract QDEF (quantum dot film, manufactured by 3M) from a backlight unit, and the wavelength conversion member according to each of Examples and Comparative Examples which was cut into a rectangular shape was incorporated instead of QDEF. In this way, a liquid crystal display device was prepared.

The prepared liquid crystal display device was turned on such that the entire surface was white, and the brightness thereof was measured using a brightness meter (trade name: "SR3", manufactured by Topcon Corporation) provided at a distance of 740 mm perpendicular to the surface of the light guide plate.

A: the brightness of the center of the screen was 400 cd/m$^2$ or higher

B: the brightness of the center of the screen was 300 cd/m$^2$ or higher

C: the brightness of the center of the screen was 200 cd/m$^2$ or higher

The evaluation results are shown in Table 1.

TABLE 1

| | | Thickness of Wavelength Conversion Layer (µm) | First Polymerizable Composition ||||||||
|---|---|---|---|---|---|---|---|---|---|---|
| | | | Quantum Dots 1 | Quantum Dots 2 | Compound To be Adsorbed on Quantum Dots || Polymerizable Compound || Initiator ||
| | Substrate Film | | Amount (Part(S) by Mass) | Amount (Part(S) by Mass) | Material | Amount (Part(S) by Mass) | Material | Amount (Part(S) by Mass) | Material | Amount (Part(S) by Mass) |
| Example 1 | Barrier Film 10 | 50 | 0.9 | 0.1 | GP-344 | 90 | X-22-163C | 8 | IRGACURE 290 | 1 |
| Example 2 | Barrier Film 10 | 50 | 0.9 | 0.1 | GP-344 | 90 | X-22-163C | 8 | IRGACURE 290 | 1 |
| Example 3 | Barrier Film 10 | 50 | 0.9 | 0.1 | GP-344 | 90 | X-22-1602 | 8 | IRGACURE 819 | 1 |
| Example 4 | Barrier Film 10 | 30 | 0.9 | 0.1 | GP-344 | 90 | X-22-163C | 8 | IRGACURE 290 | 1 |
| Example 5 | Barrier Film 10 | 50 | 0.9 | 0.1 | GP-344 | 90 | X-22-163C | 8 | IRGACURE 290 | 1 |
| Example 6 | Barrier Film 10 | 50 | 0.9 | 0.1 | Compound A | 98 | Compound A | | IRGACURE 290 | 1 |
| Comparative Example 1 | Barrier Film 10 | 70 | 0.9 | 0.1 | GP-344 | 99 | — | — | — | — |
| Comparative | Barrier | 50 | 0.9 | 0.1 | GP-344 | 70 | EP-4530 | 29 | — | — |

TABLE 1-continued

Example 2    Film 10

| | | Emulsion | | Mixture of Emulsion and Curing Agent or Polymerization Initiator | | | |
|---|---|---|---|---|---|---|---|
| | First Polymerizable Composition | Second Polymerizable Composition | | Emulsion | Curing Agent or Polymerization Initiator | | |
| | Amount (Part(S) by Mass) | Material | Amount (Part(S) by Mass) | Amount (Part(S) by Mass) | Material | Amount (Part(S) by Mass) | Brightness Evaluation | Adhesive Strength Evaluation |
| Example 1 | 20 | 828US | 80 | 70 | ST13 | 30 | A | A |
| Example 2 | 20 | CEL2021P | 80 | 70 | ST13 | 30 | A | A |
| Example 3 | 20 | 828US | 80 | 70 | ST13 | 30 | A | A |
| Example 4 | 40 | 828US | 60 | 75 | ST13 | 25 | A | B |
| Example 5 | 20 | CYCLOMER M100 | 80 | 99 | IRGACURE 819 | 1 | A | A |
| Example 6 | 20 | 828US | 80 | 70 | ST13 | 30 | A | A |
| Comparative Example 1 | 14 | 828US | 86 | 70 | ST13 | 30 | A | C |
| Comparative Example 2 | 20 | 828US | 80 | 70 | ST13 | 30 | C | A |

<Description of Material Name in Table>
GP-344: amino-modified silicone (manufactured by Genesee Scientific Corporation)
X-22-163C: epoxy-modified silicone (manufactured by Shin-Etsu Chemical Co., Ltd.)
X-22-1602: acrylic-modified silicone (manufactured by Shin-Etsu Chemical Co., Ltd.)
EP-4530: epoxy monomer (manufactured by Adeka Corporation)
828US: epoxy monomer (manufactured by Mitsubishi Chemical Corporation)
CEL2021P: aliphatic epoxy monomer (CYCLOMER 2021P, manufactured by Daicel Corporation)
ST13: epoxy resin curing agent (manufactured by Mitsubishi Chemical Corporation)
CYCLOMER M100: epoxycyclohexylmethyl methacrylate (manufactured by Daicel Corporation)
IRGACURE 290: photopolymerization initiator (manufactured by BASF SE)
IRGACURE 819: photopolymerization initiator (manufactured by BASF SE)

As shown in Table 1, it was found that, in Examples 1 to 6 according to the present invention, the brightness and the strength were excellent. In addition, it was found that, in the wavelength conversion member according to Example 4, the brightness equivalent to those of other Examples was able to be realized although the thickness of the wavelength conversion layer was small at 30 microns.

On the other hand, in Comparative Example 1 in which no polymerizable compound was used in the first polymerizable composition, the strength was poor. In addition, in the wavelength conversion member according to Comparative Example 2 in which the cured product formed of the first polymerizable composition had unstructured particles, the brightness was poor.

What is claimed is:

1. A wavelength conversion member, comprising a wavelength conversion layer comprising a quantum dot that emits fluorescence when excited by excitation light,
    the wavelength conversion layer comprising a second cured product and a first cured product that is dispersed as spheres in the second cured product,
    the first cured product being obtained by curing a first polymerizable composition comprising the quantum dot and a first polymerizable compound,
    the second cured product being obtained by curing a second polymerizable composition comprising a second polymerizable compound,
    wherein the first polymerizable composition comprises a compound having an amino group which is capable of being adsorbed on a surface of the quantum dot, and
    wherein the first polymerizable composition comprises:
    a mixture of: the first polymerizable compound that comprises a polysiloxane having, in its molecule, at least a polymerizable group; and
    a polysiloxane having, in its molecule, at least the amino group; or
    a polysiloxane having, in its molecule, at least the amino group and a polymerizable group.

2. The wavelength conversion member according to claim 1, wherein a sphericity of the first cured product is 0.94 or higher.

3. The wavelength conversion member according to claim 1, wherein an average particle diameter of the first cured product is from 0.5 to 5 μm.

4. The wavelength conversion member according to claim 1, wherein the first cured product is obtained by curing the first polymerizable composition by photopolymerization.

5. The wavelength conversion member according to claim 1, wherein a proportion of the first cured product in the wavelength conversion layer is 10 vol % or higher and lower than 40 vol %.

6. The wavelength conversion member according to claim 1, wherein the first polymerizable composition comprises a mixture of:
    the first polymerizable compound that comprises a polysiloxane having, in its molecule, at least a polymerizable group; and
    a polysiloxane having, in its molecule, at least the amino group.

7. The wavelength conversion member according to claim 1, wherein the first polymerizable composition comprises a polysiloxane having, in its molecule, at least the amino group and a polymerizable group.

8. The wavelength conversion member according to claim 1,
wherein the second polymerizable compound is at least one selected from the group consisting of epoxy, oxetane, and (meth)acrylate.

9. The wavelength conversion member according to claim 1,
wherein at least one surface of the wavelength conversion layer is in contact with a barrier film having an oxygen permeability of 1.00 $cm^3/(m^2 \cdot day \cdot atm)$ or lower.

10. The wavelength conversion member according to claim 1,
wherein both surfaces of the wavelength conversion layer are in contact with barrier films having an oxygen permeability of 1.00 $cm^3/(m^2 \cdot day \sim atm)$ or lower.

11. The wavelength conversion member according to claim 1,
wherein the quantum dot is at least one kind of quantum dots selected from the group consisting of:
a quantum dot (A), a center emission wavelength of which is in a wavelength range of from 600 nm to 680 nm;
a quantum dot (B), a center emission wavelength of which is in a wavelength range of from 520 nm to 560 nm; and
a quantum dot (C), a center emission wavelength of which is in a wavelength range of from 430 nm to 480 nm.

12. A backlight unit comprising:
a light source that emits primary light;
the wavelength conversion member according to claim 1, which is provided over the light source;
a retroreflecting member that is disposed so as to face the light source with the wavelength conversion member interposed therebetween; and
a reflection plate that is disposed so as to face the wavelength conversion member with the light source interposed therebetween,
the wavelength conversion member being configured to emit the fluorescence by using, as the excitation light, at least a portion of the primary light emitted from the light source, and to emit at least light that comprises secondary light consisting of the fluorescence.

13. A liquid crystal display device comprising at least the backlight unit according to claim 12 and a liquid crystal cell.

* * * * *